(12) United States Patent
Goto

(10) Patent No.: US 9,947,566 B2
(45) Date of Patent: Apr. 17, 2018

(54) SUBSTRATE ANGLE ALIGNMENT DEVICE, SUBSTRATE ANGLE ALIGNMENT METHOD, AND SUBSTRATE TRANSFER METHOD

(71) Applicant: KAWASAKI JUKOGYO KABUSHIKI KAISHA, Kobe-shi, Hyogo (JP)

(72) Inventor: Hirohiko Goto, Akashi (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 0 days.

(21) Appl. No.: 15/127,206

(22) PCT Filed: Mar. 25, 2014

(86) PCT No.: PCT/JP2014/001714
§ 371 (c)(1),
(2) Date: Sep. 19, 2016

(87) PCT Pub. No.: WO2015/145480
PCT Pub. Date: Oct. 1, 2015

(65) Prior Publication Data
US 2017/0103909 A1    Apr. 13, 2017

(51) Int. Cl.
*B65G 33/06* (2006.01)
*B65G 47/51* (2006.01)
(Continued)

(52) U.S. Cl.
CPC ........ *H01L 21/68* (2013.01); *H01L 21/67766* (2013.01); *H01L 21/67781* (2013.01)

(58) Field of Classification Search
CPC ............. Y10S 414/136; Y10S 414/135; H01L 21/681; H01L 21/683; H01L 21/68
(Continued)

(56) References Cited

U.S. PATENT DOCUMENTS 6,052,913 A * 4/2000 Kaneko ................... H01L 21/68
33/533
6,524,051 B2 * 2/2003 Nering .................. G03F 7/7075
414/331.01
(Continued)

FOREIGN PATENT DOCUMENTS

JP    2000-294619 A    10/2000
JP    2003-332405 A    11/2003

OTHER PUBLICATIONS

May 13, 2014 International Search Report issued in International Patent Application No. PCT/JP2014/001714.
(Continued)

*Primary Examiner* — Gregory W Adams
(74) *Attorney, Agent, or Firm* — Oliff PLC

(57) ABSTRACT

A substrate angle alignment device includes a plurality of holding sections which hold a plurality of substrates, respectively in such a manner that the plurality of substrates are placed to be oriented horizontally and arranged vertically, a first up-down unit including a plurality of first support sections, and a second up-down unit including a plurality of second support sections. The device repeats a series of angle alignment operations in which the plurality of holding sections are rotated together to perform angle alignment of selected one of the plurality of substrates, and the first support section corresponding to the aligned substrate is moved up to lift up the substrate with the first support section. The device moves the plurality of second support sections up together to lift up the plurality of aligned substrates supported on the plurality of first support sections, with the plurality of second support sections, respectively.

11 Claims, 18 Drawing Sheets

(51) Int. Cl.
H01L 21/68 (2006.01)
H01L 21/677 (2006.01)
(58) Field of Classification Search
USPC .... 414/217, 331.02, 331.04, 331.14, 331.18, 414/935, 936
See application file for complete search history.

(56) References Cited

U.S. PATENT DOCUMENTS

| | | | | |
|---|---|---|---|---|
| 6,658,321 | B2* | 12/2003 | Osaka | H01L 21/68 |
| | | | | 700/218 |
| 2002/0070095 | A1* | 6/2002 | Osaka | H01L 21/681 |
| | | | | 198/394 |
| 2009/0053021 | A1* | 2/2009 | Yamagishi | H01L 21/67259 |
| | | | | 414/222.02 |
| 2011/0027052 | A1* | 2/2011 | Ozawa | H01L 21/6734 |
| | | | | 414/217 |
| 2014/0196663 | A1* | 7/2014 | Kashiyama | H01L 21/681 |
| | | | | 118/712 |

OTHER PUBLICATIONS

May 13, 2014 Written Opinion issued in International Patent Application No. PCT/JP2014/001714.

\* cited by examiner

SUBSTRATE ANGLE ALIGNMENT DEVICE, SUBSTRATE ANGLE ALIGNMENT METHOD, AND SUBSTRATE TRANSFER METHOD

TECHNICAL FIELD

The present invention relates to a substrate angle alignment device and a substrate angle alignment method which align a plurality of substrates. The present invention also relates to a substrate transfer method which transfers the substrates among a substrate storage unit, the substrate angle alignment device, and a substrate treatment device.

BACKGROUND ART

As a transfer method of semiconductor wafers, it is known that a plurality of wafers are transferred (carried) in a state in which the wafers are placed to be oriented horizontally (laid down), between a wafer storage unit called a Front-Opening Unified Pod (FOUP), and an angle alignment device (aligner) which performs the angle alignment of the wafers. To perform this transfer method, Patent Literature 1 discloses an exemplary device and an exemplary method which receive a plurality of wafers placed to be oriented horizontally and perform the angle alignment of these wafers.

In the substrate angle alignment device disclosed in Patent Literature 1, three support poles are provided to extend vertically upward on one turn table, and five support pins are arranged vertically and fixed to each of the support poles. This device includes three scooping poles provided independently of the turn table and the support poles. Five scooping pins are arranged vertically and fixed to each of the scooping poles. The three scooping poles synchronously move up and down while maintaining a vertical spacing between the scooping pins. In contrast, a vertical spacing between the scooping pins is set to be smaller than that between the support pins.

In the angle alignment method disclosed in Patent Literature 1, a wafer transfer/loading unit loads the five wafers onto the five support pins, respectively, and is retracted from the substrate angle alignment device. When the five wafers are carried into the substrate angle alignment device, these wafers are supported on the turn table via the support poles, respectively, in a state in which the wafers are placed to be oriented horizontally. Then, the turn table is driven to rotate the five wafers together, and the rotational positions of the wafers are stored. Then, the turn table is driven based on the stored rotational position, and the angle alignment of the wafer at a lowermost stage is performed. Then, the scooping poles are moved up to scoop up the wafer at the lowermost stage with the scooping pins at the lowermost stage to lift up the wafer away from the support pins at the lowermost stage. As described above, the vertical spacing between the scooping pins is set to be smaller than that between the support pins. Therefore, after the scooping poles are moved up, only the wafer at the lowermost stage can be scooped up by the scooping pins, and the remaining four wafers can continue to be placed on the support pins. Then, the turn table is driven based on the stored rotational position, the angle alignment of the wafer at a second lowermost stage is performed, the scooping poles are moved up to scoop up only the wafer at the second lowermost stage with the corresponding scooping pins to lift up the wafer away from the corresponding support pins, for the above-described reason. The above-described operations are repeated in succession, starting from the wafer at the lowermost stage, until the angle alignment of the wafer at an uppermost stage is completed. The aligned wafers (the wafers for which the angle alignment is completed) are away from the support pins, and do not rotate even when the turn table operates. In this way, the aligned states of the wafers are maintained. After the angle alignment of all of the wafers ends, the scooping poles are moved down and all of the wafers are transferred together from the scooping pins and loaded together onto the support pins.

When the above-described series of operations (carry-in operation, angle alignment operation, and transfer/loading operation) end, the wafer transfer/loading unit takes out of the angle alignment device, the five aligned wafers which are placed on the support pins and are preparing for the carry-out, and transfers the aligned wafers toward the wafer storage unit.

CITATION LIST

Patent Literature

Patent Literature 1: Japanese Laid-Open Patent Application Publication No. 2000-294619

SUMMARY OF INVENTION

Technical Problem

In the device and the method disclosed in Patent Literature 1, the support pins are used as only a carry-in location to which the wafers are transferred from the wafer transfer/loading unit and as only a carry-out location from which the wafers are transferred to the wafer transfer/loading unit. When it is assumed that the five wafers are one set, the device and the method disclosed in Patent Literature 1 are incapable of receiving two sets of the wafers at the same time. Once the wafers of a certain set are carried into the angle alignment device, the wafers of a next set cannot be carried into the alignment device unless the angle alignment of the wafers of the certain set is completed and the aligned wafers are carried out of the angle alignment device. For this reason, the wafer transfer/loading unit is in a standby state in which the wafer transfer/loading unit is not holding the wafers in front of the angle alignment device for a time period from when the wafer transfer/loading unit carries the wafers into the substrate angle alignment device until the wafer transfer/loading unit carries the wafers out of the angle alignment device. This is unproductive. In addition, the angle alignment device does not perform the angle alignment operations for a period from when the aligned wafers are carried out of the angle alignment device until the wafers of a next set are carried into the angle alignment device. This is also unproductive.

To avoid the above-described unproductive standby states, the following operations may take place. While the angle alignment device is performing the above-described series of operations, the wafer transfer/loading unit moves from the angle alignment device to a treatment device, receive treated wafers (wafers for which a treatment is completed), stores the treated wafers into a wafer storage unit, and move from the wafer storage unit to thee angle alignment device. However, even in this case, the wafer transfer/loading unit which is not holding the wafers moves from the angle alignment device to the treatment device, or from the wafer storage unit to the angle alignment device. Thus, such empty state transfer by the wafer transfer/loading unit unavoidably occurs.

As described above, in the device and the method disclosed in Patent Literature 1, there exists standby time for which the wafer transfer/loading unit and the substrate angle alignment device do not operate, and the empty state transfer by the wafer transfer/loading unit unavoidably occurs, even when efforts are made to eliminate the standby time. Under the circumstances, there is a room for improvement in the operation efficiency of the angle alignment device and the transfer efficiency of the wafers.

In view of the above-described circumstances, a primary object of the present invention is to provide a device and a method which can improve the operation efficiency of angle alignment and the transfer efficiency of substrates, when the angle alignment of the substrates placed to be oriented horizontally is performed. A secondary object of the present invention is to provide a method which can improve the transfer efficiency of the substrates when the substrates are transferred among a substrate storage unit, a substrate angle alignment device, and a substrate treatment device.

Solution to Problem

The present invention has been made to achieve the above-described object. According to an aspect of the present invention, a substrate angle alignment device comprises: a plurality of holding sections which hold a plurality of substrates, respectively in such a manner that the plurality of substrates are placed to be oriented horizontally and arranged vertically; a rotation drive unit which rotates the plurality of holding sections together; a plurality of first up-down units which include a plurality of first support sections corresponding to the plurality of holding sections, respectively, and moves the plurality of first support sections between first retracted positions that are below the substrates held on the holding sections corresponding to the first support sections, respectively, and first support positions that are above the holding sections corresponding to the first support sections, respectively; a second up-down unit which includes a plurality of second support sections corresponding to the plurality of holding sections and the plurality of first support sections, respectively, and moves up and down the plurality of second support sections together between second retracted positions that are below the substrates held on the holding sections corresponding to the second support sections, respectively, and second support positions that are above the first support positions of the first support sections corresponding to the second support sections, respectively; and an up-down drive unit which drives the plurality of first up-down units and the second up-down unit.

In accordance with this configuration, the rotation drive unit and the up-down drive unit can repeat a series of angle alignment operations in which the plurality of holding sections are rotated together to perform angle alignment of selected one of the plurality of substrates, the first support section corresponding to the holding section holding the aligned substrate (the substrate for which the angle alignment is completed) is independently moved up from the first retracted position to the first support position to lift up the substrate with the first support section, while selecting the substrate in succession. This makes it possible to receive the plurality of substrates placed to be oriented horizontally, and perform the angle alignment of all of the substrates placed to be oriented horizontally, in a specified order, while rotating the plurality of holding sections together.

After that, the up-down drive unit moves up the plurality of second support sections together from the second retracted positions to the second support positions, and thus the plurality of aligned substrates supported on the plurality of first support sections, respectively, can be lifted by the plurality of second support sections, respectively. In this way, the plurality of holding sections can prepare for the carry-in of the plurality of unaligned substrates while the plurality of second support sections are preparing for the carry-out of the plurality of aligned substrates.

In the above-described configuration, from the perspective of a device which carries the substrates into the substrate angle alignment device and carries the substrates out of the substrate angle alignment device, it can transfer the unaligned substrates (the substrates for which the angle alignment is not yet completed) to the substrate angle alignment device and carry them into the holding sections. Just after the carry-in of the substrates, the device can carry the aligned substrates out of the second support sections and transfer them to another place. Thus, in the substrate angle alignment device, the unaligned substrates can be exchanged for the aligned substrates on the moment. As a result, unproductive standby time or empty state transfer does not occur.

From the perspective of the substrate angle alignment device, when the unaligned substrates are carried into the substrate angle alignment device, the aligned substrates are carried out of the substrate angle alignment device just after the carry-in of the substrates. Therefore, the substrate angle alignment device can start an operation for the angle alignment just after the aligned substrates have been carried out of the substrate angle alignment device. The substrate angle alignment device may complete the angle alignment of the substrates carried into the substrate angle alignment device, by the time when the substrates are subsequently carried into the substrate angle alignment device. Therefore, the standby time of the substrate angle alignment device does not occur.

The rotation drive unit may include: a single rotation drive source; and a rotation transmission mechanism which transmits a driving force generated by the rotation drive source to each of the plurality of holding sections to rotate the plurality of holding sections together.

In accordance with this configuration, since the single rotation drive source rotates the plurality of holding sections together, the constituents of the device can be reduced in number. As a result, the substrate angle alignment device with a small size and a light weight can be manufactured at low cost.

Each of the plurality of holding sections may be a turn table which is rotatable around a center axis thereof, each of the plurality of first support sections may constitute a pair of first support sections which are disposed to sandwich therebetween the turn table in a direction perpendicular to a substrate carry-in direction, and each of the plurality of second support sections may constitute a pair of second support sections which are disposed to sandwich therebetween the turn table in the direction perpendicular to the substrate carry-in direction.

In accordance with this configuration, when the plurality of substrates are carried into the plurality of turn tables, respectively, the first support sections and the second support sections do not impede the carry-in of the substrates. When the pair of first support sections are moved up, a pair of edge portions of the substrate held on the turn table, which protrude from the turn table to both sides in the perpendicular direction (direction perpendicular to the substrate carry-in direction), can be supported from below. The pair of first support sections can suppress a rotation moment around the axis in the substrate carry-in direction from acting on the substrate, and lift up the substrate in a well-balanced manner. The same applies to the second support sections.

The pair of first support sections may be provided on a reference line extending through a center of the turn table and in the direction perpendicular to the substrate carry-in direction, when viewed from above, and the second support section on a first side in the direction perpendicular to the substrate carry-in direction, of the pair of second support sections, may be composed of a pair of second support sections which are disposed to sandwich the first support section on the first side in the substrate carry-in direction, and the second support section on a second side in the direction perpendicular to the substrate carry-in direction, of the pair of second support sections, may be composed of a pair of second support sections which are disposed to sandwich the first support section on the second side in the substrate carry-in direction.

In accordance with this configuration, since the pair of first support sections are provided on the reference line, the pair of first support sections can suppress a rotation moment around the axis in the perpendicular direction from acting on the substrate, and lift up the substrate in a well-balanced manner. The pair of second support sections are composed of the pair of second support sections on the first side in the perpendicular direction and the pair of second support sections on the second side in the perpendicular direction in such a manner that the pair of second support section on the first side are disposed to sandwich the corresponding first support section in the substrate carry-in direction, and the pair of second support section on the second side are disposed to sandwich the corresponding first support section in the substrate carry-in direction. As a result, the substrate can be supported on four points. Therefore, as in the first support sections, the substrate can be supported on the pair of second support sections in a well-balanced manner.

The first up-down unit may include: a base mount disposed below the holding section at a lowermost stage and extending in the direction perpendicular to the substrate carry-in direction, and a pair of pole members extending upward from both ends of the base mount, and the pair of first support sections may be provided on the pair of pole members, respectively, and the turn table may be one of a plurality of turn tables which are arranged vertically in a space surrounded by the base mount and the pair of pole members.

In accordance with this configuration, it becomes possible to move up and down the pair of first support sections, and sandwich the turn table in the perpendicular direction with the pair of first support sections.

The second up-down unit may include: a base mount disposed below the holding section at the lowermost stage and extending in the direction perpendicular to the substrate carry-in direction, and four pole members coupled to the base mount, and the first up-down unit may be accommodated in an inner region of the second up-down unit which is surrounded by the four pole members, and the second support sections may be provided on the four pole members, respectively.

In accordance with this configuration, the four separate second support sections can be moved up and down together, the first support section can be sandwiched between the second support sections in the substrate carry-in direction, and the second up-down unit and the first up-down unit can be mounted compactly.

The up-down drive source may include a circumvention drive source which retracts the plurality of second support sections to positions that are outward relative to outer peripheral edges of the substrates held on the holding sections, corresponding to the second support sections, respectively, and the up-down drive unit may be configured to move down the plurality of second support sections together from the second support positions to the second retracted positions, respectively, while circumventing the substrates held on the holding sections, respectively.

In accordance with this configuration, even in a state in which the substrates are held on the holding sections, respectively, the second support sections can be moved down to the second retracted positions without interference with the substrates, respectively.

According to another aspect of the present invention, there is provided a substrate angle alignment method which uses a substrate angle alignment device including a plurality of holding sections, a plurality of first support sections which correspond to the plurality of holding sections, respectively, and are moved up and down independently, and a plurality of second support sections which correspond to the plurality of holding sections and the plurality of first support sections, respectively, and are moved up and down together, the substrate angle alignment method comprising: holding a plurality of substrates on the plurality of holding sections, respectively in such a manner that the plurality of substrates are placed to be oriented horizontally and arranged vertically; repeating a series of angle alignment operations in which the plurality of holding sections are rotated together to perform angle alignment of selected one of the plurality of substrates, and the first support section corresponding to the holding section holding the substrate which has been aligned is independently moved up to lift up the substrate with the first support section while selecting the substrate in succession; and performing a first transfer/loading operation in which the plurality of second support sections are moved up together to lift up the plurality of aligned substrates which are supported on the plurality of first support sections, with the plurality of second support sections, respectively.

In accordance with this method, as in the above-described substrate angle alignment device, the plurality of holding sections can prepare for the carry-in of the plurality of unaligned substrates while the plurality of second support sections are preparing for the carry-out of the plurality of aligned substrates. Therefore, from the perspective of the device which carries the substrates into the substrate angle alignment device and carries the substrates out of the substrate angle alignment device, unproductive standby time or empty state transfer does not occur. Also, from the perspective of the substrate angle alignment device, the standby time of the substrate angle alignment device does not occur.

After the first transfer/loading operation is performed, the plurality of first support sections may be moved down to positions that are below the plurality of holding sections corresponding to the plurality of first support sections, respectively, before the plurality of substrates which are unaligned are held on the plurality of holding sections, respectively.

Just after the first transfer/loading operation has been performed, the substrates are not held on any of the holding sections.

In accordance with this method, for example, when the unaligned substrates are newly carried into the holding sections, the first support sections are moved down to positions that are below the corresponding holding sections, respectively, before the unaligned substrates are held on the holding sections, respectively. Therefore, the first support sections can be moved down without interference with the substrates even when the first support sections do not include a particular structure for circumventing the substrates, and can prepare for the series of angle alignment operations which will take place next.

The substrate angle alignment method preferably comprises: when the first transfer/loading operation is performed, the plurality of unaligned substrates are carried into the plurality of holding sections, respectively, and the plurality of aligned substrates are carried out of the plurality of second support sections, respectively, repeating the series of angle alignment operations; and performing a second transfer/loading operation in which the plurality of first support sections are moved down together to transfer and load the plurality of aligned substrates which are supported on the plurality of first support sections, to the plurality of holding sections, respectively, when the second transfer/loading operation is performed, the plurality of unaligned substrates are carried into the plurality of second support sections, respectively, and the plurality of aligned substrates are carried out of the plurality of holding sections, respectively; moving down the plurality of second support sections together to transfer and load the plurality of unaligned substrates which are supported on the plurality of second support sections, to the plurality of holding sections, respectively; repeating the series of angle alignment operations; and performing the first transfer/loading operation.

In accordance with this method, the aligned substrates are returned to their carry-in location. The carry-in location of the substrates is switched between the holding sections and the second support sections in an alternate manner. In this configuration, even when the second support sections do not include a particular structure for circumventing the substrates, the second support sections can be moved up and down between the second support positions and the second retracted positions without interference with the substrates.

Specifically, after the first transfer/loading operation is performed, the second support sections are located above the corresponding holding sections, respectively. When the series of angle alignment operations are repeated and the second transfer/loading operation is performed, the plurality of aligned substrates are transferred and loaded onto the plurality of holding sections, respectively. During this operation, the second support sections need not be moved. Also, the second support sections are permitted to be in a stopped state because they do not interfere with the substrates.

After the second transfer/loading operation is performed, the second support sections receive the unaligned substrates, wait for the aligned substrates to be carried out of the holding sections, and then are moved down. Therefore, the second support sections can be moved down to the second retracted positions without interference with the substrates, respectively, and the unaligned substrates can be transferred and loaded onto the holding sections, respectively. In addition, the holding sections and the first support sections can repeat the series of angle alignment operations. When the series of angle alignment operations end, the second support sections are moved up and lift up the aligned substrates, respectively, by the first transfer/loading operation. During this up movement, the second support sections do not interfere with the substrates, respectively.

The substrate angle alignment method may comprise: when the first transfer/loading operation is performed, the plurality of unaligned substrates are carried into the plurality of holding sections, respectively, and the plurality of aligned substrates are carried out of the plurality of second support sections, respectively, moving down the plurality of second support sections together to positions that are below the holding sections corresponding to the second support sections, respectively, while circumventing the substrates held on the holding sections, respectively; repeating the series of angle alignment operations; and performing the first transfer/loading operation.

In accordance with this method, even when the substrates are carried into the holding sections before the second support sections are moved down, the second support sections can be moved down without interference within the substrates. In this configuration, the carry-in location of the substrates is limited to the holding sections, and the carry-out location of the substrates is limited to the second support sections located at the up positions. Therefore, from the perspective of the device which carries the substrates into the substrate angle alignment device and carries the substrates out of the substrate angle alignment device, the carry-in operation and the carry-out operation of the substrates can be simplified, and a teaching operation in a case where a robot performs the carry-in and carry-out of the substrates can be simplified.

According to another aspect of the present invention, there is provided a substrate transfer method which transfers substrates among a substrate storage unit which stores the substrates therein, a substrate angle alignment device which performs angle alignment of the substrates, and a substrate treatment device which treats the substrates, the substrate transfer method comprising: a first exchange step in which the substrates which are unaligned are carried into the substrate angle alignment device, and the substrates which have been aligned are carried out of the substrate angle alignment device; a first transfer step in which the aligned substrates are transferred to the substrate treatment device; a second exchange step in which the aligned substrates are carried into the substrate treatment device and the substrates which have been treated are carried out of the substrate treatment device; a second transfer step in which the treated substrates are transferred to the substrate storage unit; a third exchange step in which the treated substrates are carried into the substrate storage unit, and the unaligned substrates are carried out of the substrate storage unit; and a third transfer step in which the unaligned substrates are transferred to the substrate angle alignment device.

In accordance with this method, in the substrate angle alignment device, the unaligned substrates can be exchanged for the aligned subjects on the moment. Therefore, in the first transfer step, the second transfer step, and the third transfer step which are performed thereafter, the empty state transfer does not occur. Since the empty state transfer does not occur, the transfer of the substrates in one cycle is completed merely by going one round around a cyclic path from the substrate angle alignment device to the substrate angle alignment device by way of the substrate treatment device and the substrate storage unit. As a result, the transfer efficiency of the substrates can be significantly improved.

Advantageous Effects of Invention

As should be appreciated from the foregoing description, the present invention can provide a device and a method which can improve the operation efficiency of angle alignment and the transfer efficiency of substrates, when the angle alignment is performed for the substrates placed to be oriented horizontally. In addition, the present invention can provide a method which can improve the transfer efficiency of the substrates when the substrates are transferred among a substrate storage unit, a substrate angle alignment device, and a substrate treatment device.

DESCRIPTION OF EMBODIMENTS

Hereinafter, embodiments will be described with reference to the drawings. Throughout the drawings, the same or corresponding components are designated by the same reference symbols and will not be described repeatedly.

Figure 1:
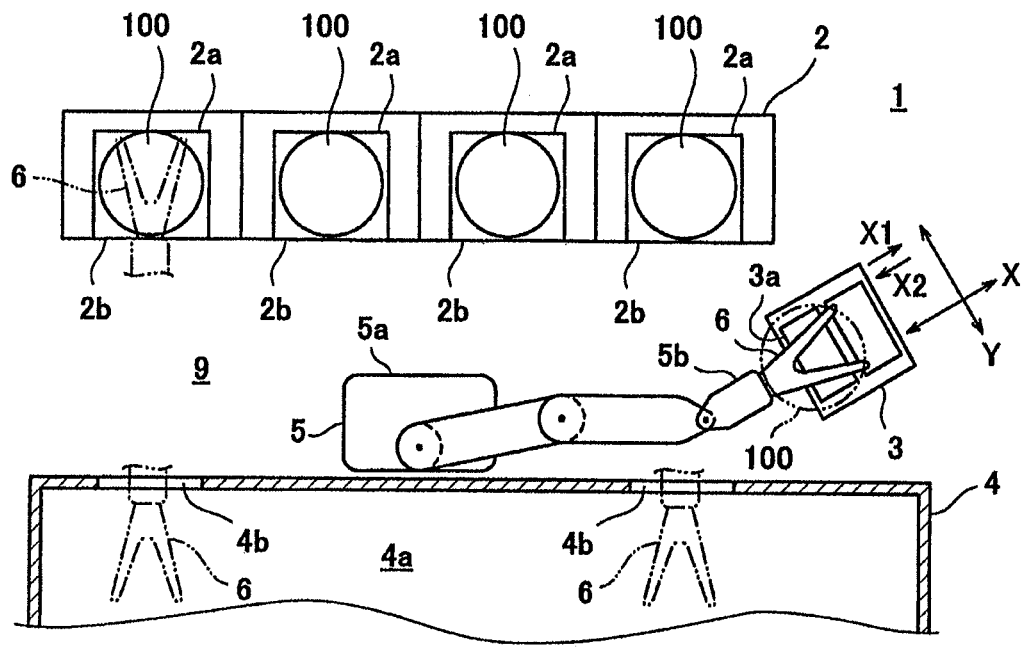
FIG. 1 is a plan view showing a part of a substrate treatment system including an angle alignment device according to an embodiment.

FIG. 1 is a plan view showing a part of a substrate treatment (processing) system 1 including an angle alignment device according to the embodiment. The substrate treatment system 1 of FIG. 1 is configured to perform specified treatments (e.g., thermal treatment, impurity implantation treatment, thin film formation treatment, lithography treatment, washing treatment, flattening treatment) for substrates 100 such as semiconductor wafers. In the description below, the substrates 100 are the semiconductor wafers of a disc shape unless otherwise noted. Alternatively, the substrate treatment system 1 may perform the specified treatments for substrates different from the semiconductor wafers.

As shown in FIG. 1, the substrate treatment system 1 according to the present embodiment includes a storage unit 2 which stores substrates 100 therein, an angle alignment device 3 which performs the angle alignment of the substrates 100, a treatment device 4 which performs a treatment for the substrates 100, and a transfer robot 5 which transfers the substrates 100. The storage unit 2 is placed to be distant from the treatment device 4 in such a manner that a transfer space 9 in which the angle alignment device 3 and the transfer robot 5 are placed is provided between the storage unit 2 and the treatment device 4.

A plurality of containers 2a each of which stores the plurality of substrates 100 therein are provided in the storage unit 2. Each of the plurality of containers 2a is capable of storing therein the plurality of substrates 100 in a state in which the substrates 100 are placed to be oriented horizontally and arranged vertically to be spaced apart from each other. In a case where the substrates 100 are the semiconductor wafers, FOUP may be suitably used as the containers 2a. The substrates 100 stored in the container 2a are carried into the substrate treatment system 1. At this moment, the angle alignment of the substrates 100 is not yet completed, and a specified treatment for the substrates 100 is not yet completed. The containers 2a are provided in the storage unit 2 in such a manner that substrate inlets/outlets 2b face the transfer space 9.

The angle alignment device 3 receives the substrates 100 which have been carried out of the container 2a and are unaligned (the substrates 100 for which the angle alignment is not yet completed), performs the angle alignment of the substrates 100, and prepares for the carry-out of the aligned substrates 100 (substrates 100 for which the angle alignment is completed). The angle alignment is defined as aligning the orientations of the substrates 100 in a circumferential direction thereof. More specifically, the angle alignment is defined as aligning the angular positions of notches or orientation flats formed on the outer peripheries of the substrates. Alternatively, the angle alignment device 3 may perform position alignment of the substrates 100. The treatment device 4 receives the substrates 100 having been aligned by the angle alignment device 3, and treats the substrates 100 (performs a specified treatment for the substrates 100). The treatment device 4 includes a treatment chamber 4a for performing the treatment. A wall defining the treatment chamber 4a is provided with substrate inlets/outlets 4b via which the transfer space 9 is in communication with the treatment chamber 4a. The treated substrates 100 (the substrates 100 for which the treatment is completed) are returned to the container 2a, and prepares for being carried out of the substrate treatment system 1 in a state in which the substrates 100 are stored in the container 2a.

The transfer robot 5 transfers the substrates 100 among the storage unit 2, the angle alignment device 3, and the treatment device 4. For example, the transfer robot 5 transfers the unaligned substrates 100 to the angle alignment device 3, transfers the aligned substrates 100 to the treatment device 4, and transfers the treated substrates 100 to the container 2a. The transfer robot 5 includes a base mount 5a disposed in the transfer space 9, and at least one arm 5b movably provided on the base mount 5a. A hand 6 for holding the substrates 100 is attached to the tip end portion of the arm 5b. The hand 6 is, for example, a thin plate member including a pair of tip end portions which are fork portions. The hand 6 holds the substrates 100 in such a manner that the substrates 100 are placed or held on the upper surface of the hand 6.

Figure 2:
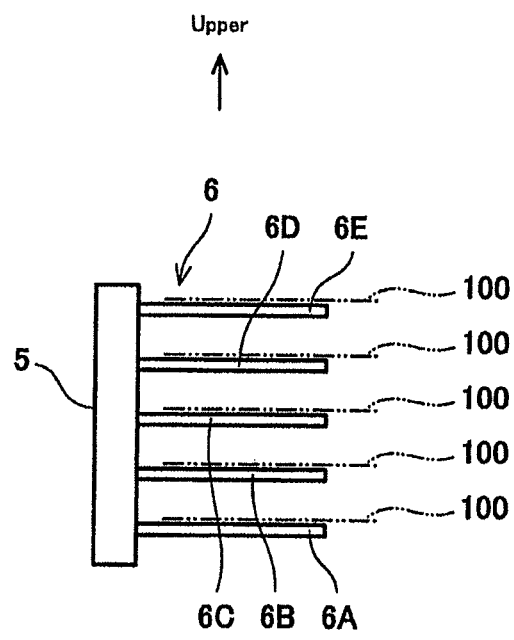
FIG. 2 is a side view showing a hand of FIG. 1.

FIG. 2 is a side view showing the hand 6 of FIG. 1. As shown in FIG. 2, in the present embodiment, a plurality of (e.g., five) hands 6A to 6E are attached to the transfer robot 5, and the hands 6A to 6E hold the plurality of (e.g., five) substrates 100, respectively. The hands 6A to 6E are arranged to be vertically spaced apart from each other. The hands 6A to 6E are capable of holding the plurality of substrates 100, respectively, in a state in which the substrates 100 are placed to be oriented horizontally and arranged to be vertically spaced apart from each other. The transfer robot 5 is capable of moving up and down the hands 6A to 6E together while maintaining a vertical spacing between adjacent ones of the hands 6A to 6E.

Figure 3:
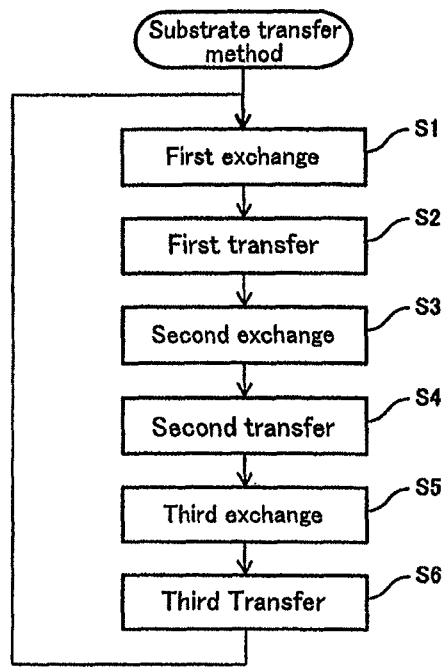
FIG. 3 is a flowchart showing the flow of the steps of a substrate transfer method according to the embodiment, which is performed within the substrate treatment system of FIG. 1.
Figure 4:
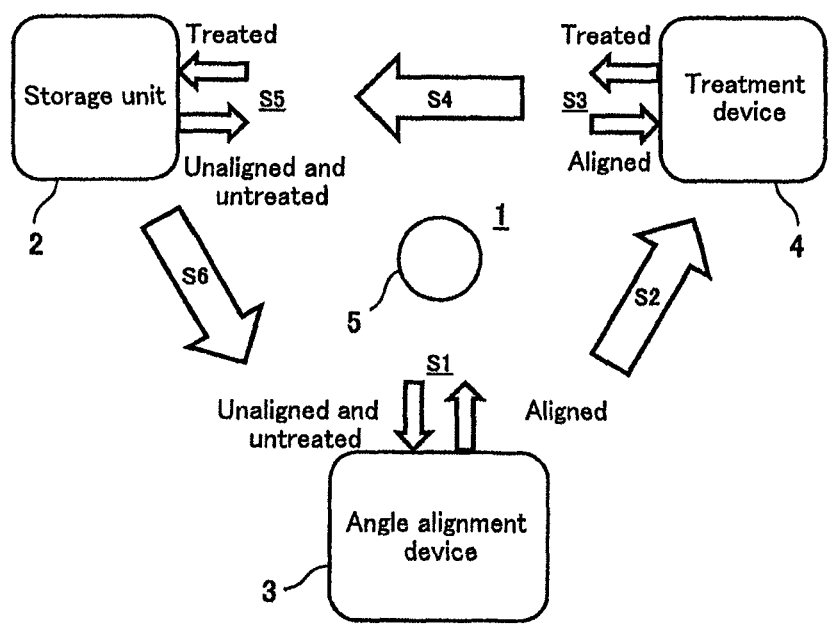
FIG. 4 is a flowchart showing the flow of substrates in a case where the substrate transfer method of FIG. 3 is performed.

FIG. 3 is a flowchart showing the flow of the steps of a substrate transfer method S0 performed within the substrate treatment system 1 of FIG. 1. FIG. 4 is a flowchart showing the flow of the substrates within the substrate treatment system 1 in a case where the substrate transfer method S0 of FIG. 3 is performed. The substrate transfer method S0 is a method which transfers the substrates among the storage unit 2, the angle alignment device 3, and the treatment device 4.

As shown in FIG. 3, the substrate transfer method S0 according to the present embodiment includes a first exchange step S1, a first transfer step S2, a second exchange step S3, a second transfer step S4, a third exchange step S5, and a third transfer step S6, and performs these six steps S1 to S6 in this order. In the substrate treatment system 1, the six steps S1 to S6 are performed in one cycle to transfer the substrates. When the third transfer step S6 ends, the process returns to the first exchange step S1, and a next cycle starts. For easier understanding of the description, it is supposed that the first step of the cycle is the first exchange step S1. This is merely exemplary, and any one of the six steps S1 to S6 may be the first step.

As shown in FIG. 4, in the first exchange step S1, the substrates which are unaligned and untreated (the substrates 100 for which the angle alignment and the treatment are not yet completed) are carried into the angle alignment device 3, and the aligned substrates are carried out of the angle alignment device 3. More specifically, the transfer robot 5 carries into the angle alignment device 3 the plurality of substrates which are unaligned and held on the hands 6A to 6E (see FIG. 2), respectively. Just after this carry-in has ended, the transfer robot 5 holds with the hands 6A to 6E, the plurality of aligned substrates which are preparing for the carry-out in the angle alignment device 3, and carries the plurality of aligned substrates out of the angle alignment device 3. Thus, in the first exchange step S1, the hands 6A to 6E switch the substrates held on the hands 6A to 6E, from the substrates which are unaligned and untreated to the aligned substrates.

The angle alignment device 3 is capable of receiving the plurality of substrates placed to be oriented horizontally, and performing the angle alignment of the plurality of substrates carried thereinto, while maintaining a state in which the plurality of substrates are placed to be oriented horizontally. The angle alignment device 3 is capable of supporting the plurality of aligned substrates in a state in which the aligned substrates are placed to be oriented horizontally, and preparing for the carry-out of the aligned substrates. Thus, the angle alignment device 3 according to the present embodiment is configured to receive the plurality of unaligned substrates while preparing for the carry-out of the plurality of aligned substrates. Therefore, the first exchange step S1 can be performed.

In the first transfer step S2, the transfer robot 5 transfers the aligned substrates to the treatment device 4. At this time, the transfer robot 5 may transfer the plurality of aligned substrates having been carried out of the angle alignment device 3 in the first exchange step S1, directly from the angle alignment device 3 to the treatment device 4.

In the second exchange step S3, the transfer robot 5 carries the aligned substrates into the treatment device 4 and carries the treated substrates out of the treatment device 4. Specifically, the hands 6A to 6E move into the treatment chamber 4a (see FIG. 1) through the substrate inlet/outlet 4b (see FIG. 1), and thereby carry the plurality of aligned substrates being held on the hands 6A to 6E (see FIG. 2) from the transfer space 9 (see FIG. 1) into the interior of treatment chamber 4a. Then, the hands 6A to 6E move down together and thereby place the plurality of aligned substrates being held on the hands 6A to 6E in predetermined carry-in positions, respectively, in the interior of treatment chamber 4a. Just after this carry-in has ended, the hands 6A to 6E which are empty hold the plurality of treated substrates, respectively which are preparing for the carry-out in predetermined carry-out positions, respectively, in the interior of treatment chamber 4a. Then, the hands 6A to 6E exit the treatment chamber 4a through the substrate inlet/outlet 4b and thereby carries the plurality of treated substrates being held on the hands 6A to 6E out of the treatment chamber 4a and to the transfer space 9. Thus, in the second exchange step S3, the hands 6A to 6E switch the substrates held on the hands 6A to 6E from the aligned substrates to the treated substrates.

In the second transfer step S4, the transfer robot 5 transfers the treated substrates to the storage unit 2. At this time, the transfer robot 5 may transfer the plurality of treated substrates having been carried out of the treatment device 4 in the second exchange step S3, directly from the treatment device 4 to the storage unit 2.

In the third exchange step S5, the transfer robot 5 carries the treated substrates into the storage unit 2 and carries the unaligned and untreated substrates out of the storage unit 2. Specifically, the hands 6A to 6E move into the container 2a (FIG. 1) through the substrate inlet/outlet 2b (see FIG. 1), and thereby carry the plurality of treated substrates being held on the hands 6A to 6E (see FIG. 2) from the transfer space 9 (see FIG. 1) into the container 2a. Then, the hands 6A to 6E move down together and place the plurality of treated substrates being held on the hands 6A to 6E in predetermined storage positions, respectively, in the interior of the container 2a. At this time, the plurality of substrates are stored in the interior of the container 2a in a state in which the substrates are placed to be oriented horizontally and arranged to be vertically spaced apart from each other. Just after this carry-in has ended, the hands 6A to 6E which are empty exit the container 2a through the substrate inlet/outlet 2b of the container 2a. Then, the hands 6A to 6E which are empty move into another container 2a in which the unaligned and untreated substrates are stored, through the substrate inlet/outlet 2b of another container 2a. Then, the hands 6A to 6E move up together, and thereby hold the plurality of unaligned and untreated substrates placed in the predetermined storage positions, respectively, in the interior of another container 2a. Then, the hands 6A to 6E exit the container 2a through the substrate inlet/outlet 2b and thereby carries the plurality of unaligned and untreated substrates being held on the hands 6A to 6E out of the container 2a and to the transfer space 9. Thus, in the third exchange step S5, the hands 6A to 6E switch the substrates held on the hands 6A to 6E, from the treated substrates to the unaligned and untreated substrates.

In the third transfer step S6, the transfer robot 5 transfers the unaligned and untreated substrates to the angle alignment device 3. At this time, the transfer robot 5 may transfer the plurality of unaligned and untreated substrates having been carried out of the storage unit 2 in the third exchange step S5, directly from the storage unit 2 to the angle alignment device 3.

Figure 5:
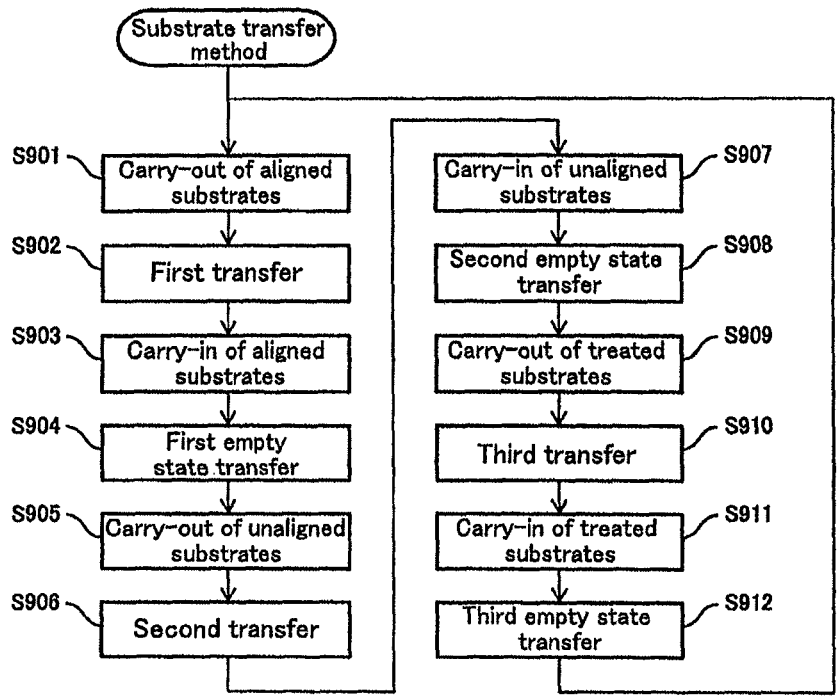
FIG. 5 is a flowchart showing the flow of the steps of a substrate transfer method performed within a substrate treatment system including an angle alignment device according to a comparative example.
Figure 6:
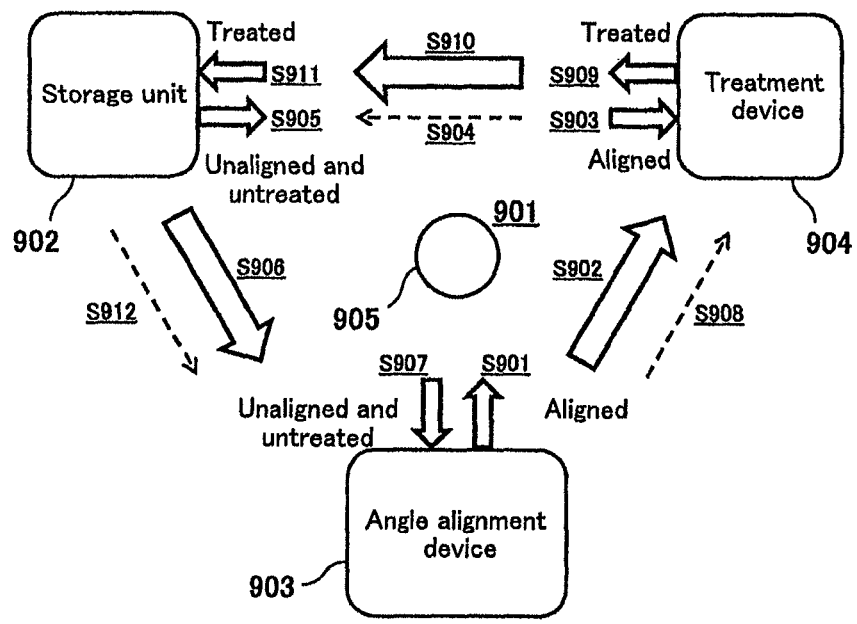
FIG. 6 is a flowchart showing the flow of substrates in a case where the substrate transfer method of FIG. 5 is performed.

The operation of the substrate transfer method S0 according to the present embodiment will be described with reference to the comparative example. FIG. 5 is a flowchart showing the flow of the steps of a substrate transfer method S900 performed within a substrate treatment system 901 according to a comparative example. FIG. 6 is a flowchart showing the flow of the substrates within the substrate treatment system 901 in a case where the substrate transfer method S900 of FIG. 5 is performed.

As shown in FIG. 6, the substrate treatment system 901 according to the comparative example includes a storage unit 902, an angle alignment device 903, a treatment device 904, and a transfer robot 905, as in the present embodiment, and a hand (not shown) is attached to the transfer robot 905. Unlike the present embodiment, the angle alignment device 903 according to the comparative example is unable to receive the unaligned substrates before the aligned substrates are carried out of the angle alignment device 903. In other words, the angle alignment device 903 is unable to receive the unaligned substrates while preparing for the carry-out of the aligned substrates.

As shown in FIGS. 5 and 6, in the substrate transfer method S900 according to the comparative example, the transfer robot 905 carries the aligned substrates out of the angle alignment device 903 (S901), transfers the aligned substrates to the treatment device 904 (S902) and carries the aligned substrates into the treatment device 904 (S903). Then, the transfer robot 905 moves to the storage unit 902 without holding the substrates with the hand (S904). In brief, a first empty state transfer is performed.

Then, the transfer robot 905 carries the unaligned and untreated substrates out of the storage unit 902 (S905), transfers the unaligned substrates to the angle alignment device 903 (S906), and carries the unaligned substrates into the angle alignment device 903 (S907). Then, the transfer robot 905 move to the treatment device 904 without holding the substrates with the hand (S908). In brief, a second empty state transfer is performed.

Then, the transfer robot 905 carries the treated substrates out of the treatment device 904 (S909), transfers the treated substrates to the storage unit 902 (S910), and carries the aligned substrates into the storage unit 902 (S911). Then, the transfer robot 905 move to the angle alignment device 903 without holding the substrates with the hand (S912). In brief, a third empty state transfer is performed.

In the substrate treatment system 901, the above-described twelve steps S901 to S912 are performed in one cycle to transfer the substrates. The twelve steps S901 to S912 include six steps in which the hand moves. The hand goes two rounds around a cyclic path from the angle alignment device 903 to the angle alignment device 903 by way of the treatment device 904 and the storage unit 902, in one cycle. After the third empty state transfer step S912 ends, the process returns to the step S901 in which the transfer robot 905 carries the substrates out of the angle alignment device 903, and then a next cycle starts.

Figure 7:
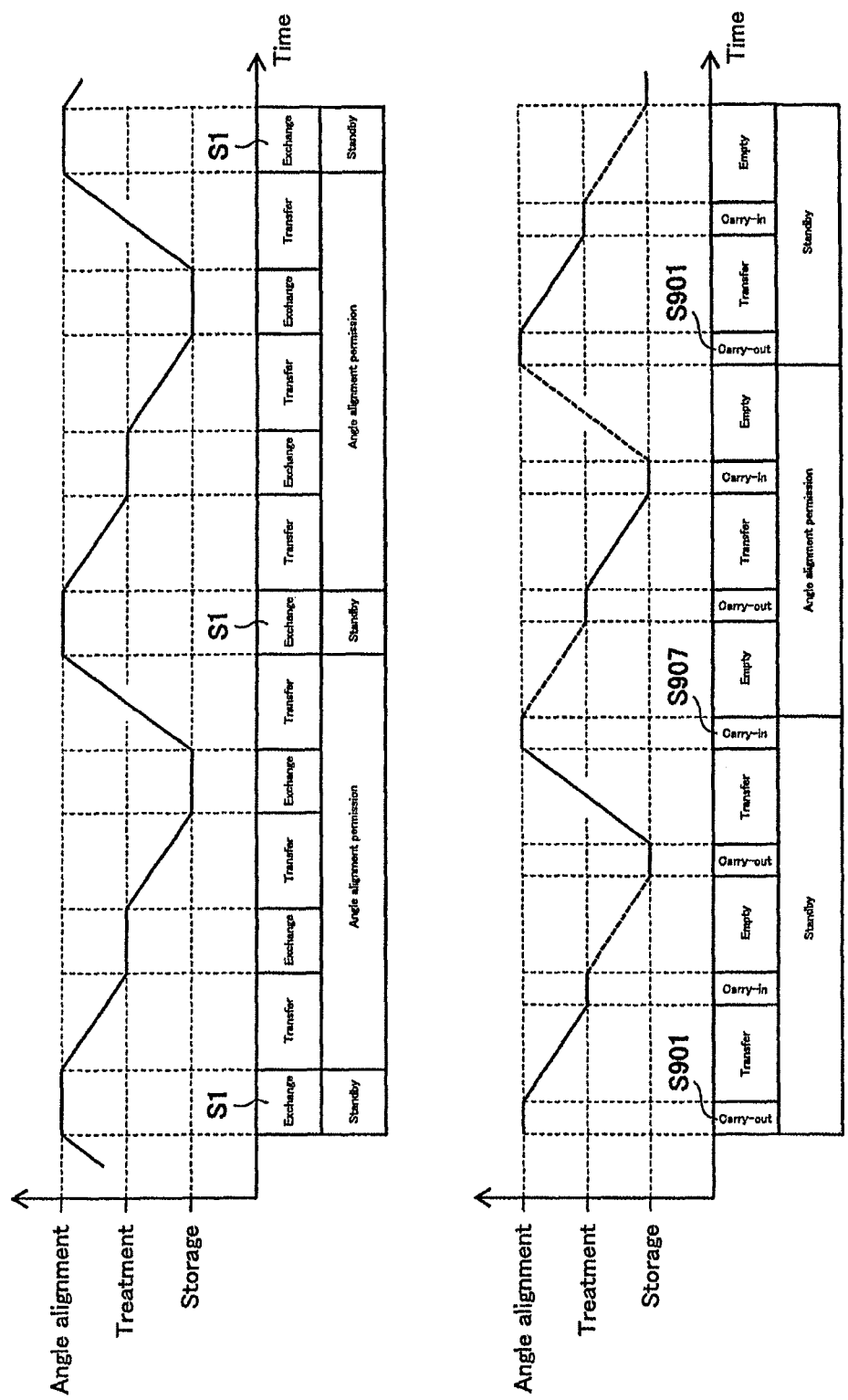
FIG. 7 is a view showing a time chart in a case where the substrate transfer method according to the embodiment is performed, and a time chart in a case where the substrate transfer method according to the comparative example is performed.

FIG. 7 is a view showing a time chart in a case where the substrate transfer method S0 according to the embodiment is performed, and a time chart in a case where the substrate transfer method S900 according to the comparative example is performed. In the description below with reference to FIG. 7, the components included in the system and the steps included in the method are designated by the reference symbols shown in FIGS. 1 to 6.

In FIG. 7, the upper time chart indicates the time chart according to the present embodiment, while the lower time chart indicates the time chart according to the comparative example. The time chart according to the present embodiment indicates on the same time axis a change in the position of the hand, proceeding of the steps of the substrate transfer method S0, and a change in the state of the angle alignment device 3. The position of the hand is indicated on one axis for simpler illustration, and therefore an oblique line indicating the change in the position of the hand moving between the storage unit 2 and the angle alignment device 3 crosses a dotted line indicating the position of the treatment device 4. However, as described above, the hand 6 does not go through the treatment device 4 while the hand is moving. The time chart according to the comparative example is depicted as in the time chart according to the present embodiment.

For the purpose of easier understanding of the description, it is assumed that in the present embodiment, three kinds of movement times, namely, time of movement between the storage unit 2 and the angle alignment device 3, time of movement between the angle alignment device 3 and the treatment device 4, and time of movement between the treatment device 4 and the storage unit 2 are equal to each other. Also, it is assumed that in the present embodiment, three kinds of substrate exchange times, namely, the substrate exchange time in the storage unit 2, the substrate exchange time in the angle alignment device 3, and the substrate exchange time in the treatment device 4 are equal to each other. For the purpose of comparison, it is assumed that three kinds of movement times according to the comparative example are equal to the corresponding ones of the three kinds of movement times according to the present embodiment, respectively. Also, it is assumed that six kinds of times, namely, three kinds of substrate carry-in times and three kinds of substrate carry-out times according to the comparative example are equal to each other. Also, total time which is a sum of the substrate carry-in time for one carry-in operation and the substrate carry-out time for one carry-out operation according to the comparative example is equal to the substrate exchange time for one exchange operation according to the present embodiment.

In the comparative example, one cycle is not completed unless the transfer robot 905 goes two rounds around the above-described cyclic path. The dotted line of the line indicating the change in the position of the hand according to the comparative example indicates the empty state transfer. Time required for the hand to go one round around the cyclic path, of time required for the hand to go two rounds around the cyclic path, is spent in the empty state transfer. In the substrate transfer method S900 according to the comparative example, the transfer robot 905 performs the carry-in of the substrates to a certain component (902, 903, or 904) and the carry-out of the substrates from this component at timings which are apart from each other in time. The hand goes one round around the cyclic path and returns to this component, for a time period from when the carry-in of the substrates to this component is completed until the carry-out of the substrates from this component starts. For this reason, one cycle cannot be completed unless the hand goes two rounds around the cyclic path, and thus time required for the hand to go one round around the cyclic path is spent in the empty state transfer.

In contrast, in the substrate transfer method S0 according to the present embodiment, just after the transfer robot 5 has carried the substrates into a certain component (2, 3, or 4), the transfer robot 5 carries the substrates out of this component on the moment. Thus, the transfer robot 5 does not move away from this component between the carry-in and the carry-out. Therefore, in the present embodiment, when the hand 6 goes one round around the cyclic path from the angle alignment device 3 to the angle alignment device 3 by way of the treatment device 4 and the storage unit 2, one cycle is completed. Thus, in the present embodiment, time required for the hand to go one round around the cyclic path is not spent in the empty state transfer. Therefore, tact time according to the present embodiment is reduced to a half of the tact time according to the comparative example. As a result, the transfer efficiency of the substrates can be significantly increased.

Each of the time charts indicates as the change in the state of the corresponding angle alignment device 3, 903, shifting between two states which are a state in which the corresponding angle alignment device 3, 903 is permitted to perform the angle alignment (hereinafter this state will be simply referred to as "angle alignment permission state") and a state in which the corresponding angle alignment device 3, 903 is not permitted to perform the angle alignment and is compelled to standby (hereinafter this state will be simply referred to as "standby state"). As a result, continuation time of the angle alignment permission state (hereinafter this time will be referred to as "permission time") and continuation time of the standby state (hereinafter this time will be referred to as "standby time") are shown.

In the comparative example, the angle alignment device 903 is in the standby state during a time period from when the step S901 in which the transfer robot 905 carries the substrates out of the angle alignment device 903 starts until the step S907 in which the transfer robot 905 carries the unaligned substrates into the angle alignment device 903 ends (execution time of the steps S901 to step S907). The angle alignment device 903 can be in the angle alignment permission state only during a time period from when the carry-in step S907 ends until the carry-out step S901 in a next cycle starts (execution time of the steps S908 to step S912). Specifically, the permission time of the comparative example merely includes the time required for the hand to go one round around the above-described cyclic path (total execution time of the steps S908, S910, and S912), the substrate carry-out time (execution time of the step S909) in the treatment device 904, and the substrate carry-in time (execution time of the step S911) in the storage unit 902.

In contrast, in the present embodiment, the angle alignment device 3 is in the standby state during the execution time of the first exchange step S1, but is in the angle alignment permission state during a time period from when the first exchange step S1 ends until the first exchange step S1 in a next cycle starts (execution time of the steps S2 to S6). Specifically, the permission time of the present embodiment includes the time required for the hand to go one round around the above-described cyclic path (total execution time of the first transfer step S2, the second transfer step S4, and the third transfer step S6), the substrate exchange time (execution time of the second exchange step S3) in the treatment device 4, and the substrate exchange time (execution time of the third exchange step S5) in the storage unit 2.

The standby time of the present embodiment is shorter than the standby time of the comparative example by the total time of the time required for the hand to go one round around the cyclic path and the substrate exchange time for one exchange operation. The permission time of the present embodiment is longer than the permission time of the comparative example by the total time of the substrate carry-in time for one carry-in operation and the substrate carry-out time for one carry-out operation (namely, the substrate exchange time for one exchange operation). Therefore, the operation efficiency of the angle alignment can be improved.

As should be understood from the above, in accordance with the present embodiment, the tact time can be significantly reduced and the standby time of the angle alignment device 3 can be reduced, as compared to the comparative example. In addition, the permission time of the angle alignment device 3 can be increased.

The substrate treatment system 1 according to the present embodiment can obtain the above-described advantages as compared to the comparative example. This is due to the fact that just after the substrates have been carried into each of the three components 2 to 4, the substrates are carried out of this component on the moment. The angle alignment device 3 according to the present embodiment is configured to receive the unaligned substrates while preparing for the carry-out of the aligned substrates. This makes it possible to perform the first exchange step S1 of the substrate transfer method S0. With this configuration of the angle alignment device 3, the present embodiment is obviously more advantageous than the comparative example. Hereinafter, the embodiment of the angle alignment device 3 including such a configuration will be described.

Figure 8:
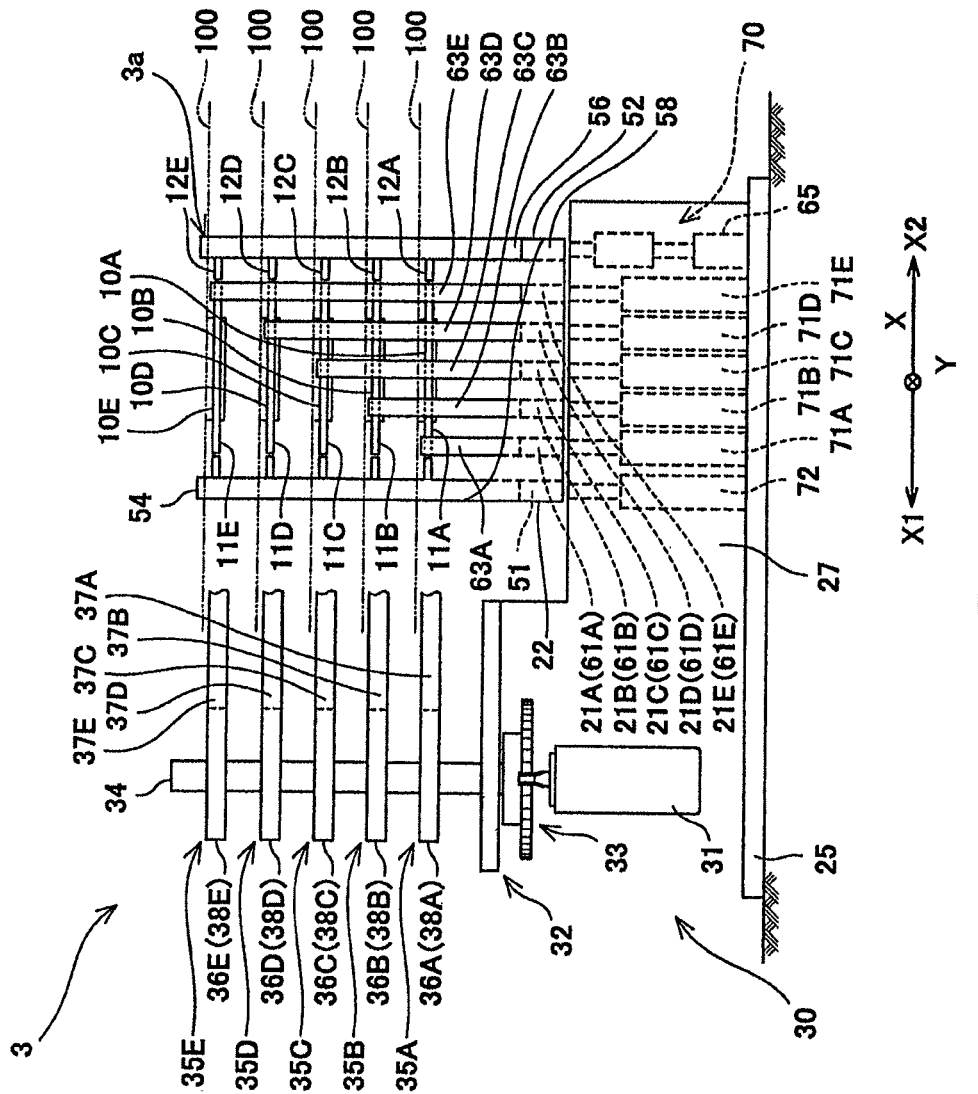
FIG. 8 is a side view of an angle alignment device according to Embodiment 1.

FIG. 8 is a side view of the angle alignment device 3 according to Embodiment 1. As shown in FIG. 8, the angle alignment device 3 according to the present embodiment includes a base mount 25 of a plate shape which is placed to be oriented horizontally in the transfer space 9, a plurality of holding sections 10A to 10E for holding the plurality of substrates 100, respectively, first up-down units 21A to 21E including a plurality of first support sections 11A to 11E, respectively, and a second up-down unit 22 including a plurality of second support sections 12A to 12E.

The plurality of holding sections 10A to 10E are configured to hold the plurality of substrates 100, respectively, in a state in which the plurality of substrates 100 are placed to be oriented horizontally and arranged to be vertically spaced apart from each other. To this end, the plurality of holding sections 10A to 10E are located above the base mount 25 and arranged to be vertically spaced apart from each other. The plurality of holding sections 10A to 10E are configured to be rotatable together. The plurality of first support sections 11A to 11E correspond to the plurality of holding sections 10A to 10E, respectively. The plurality of second support sections 12A to 12E correspond to the plurality of holding sections 10A to 10E, respectively, and the plurality of first support sections 11A to 11E, respectively. The plurality of first support sections 11A to 11E are independently moved up and down between first retracted positions that are below the substrates 100 held on the corresponding holding sections 10A to 10E, respectively, and first support positions that are above the holding sections 10A to 10E, respectively. The plurality of second support sections 12A to 12E are moved up and down together between second retracted positions that are below the substrates 100 held on the corresponding holding sections 10A to 10E, respectively, and second support positions that are above the first support positions of the corresponding first support sections 11A to 11E, respectively.

The angle alignment device 3 according to the present embodiment includes the five holding sections 10A to 10E, the five first support sections 11A to 11E corresponding to the five holding sections 10A to 10E, respectively, and the five second support sections 12A to 12E corresponding to the five holding sections 10A to 10E, respectively. Thus, the angle alignment device 3 can handle a set of five substrates 100 together. Specifically, the angle alignment device 3 receives the set of five unaligned substrates 100 carried thereinto, together, and prepares for carrying the set of five aligned substrates 100 together out of the angle alignment device 3. The number of the substrates 100 which can be handled together by the angle alignment device 3 (namely, the number of the holding sections 10A to 10E) can be suitably changed.

The angle alignment device 3 includes a substrate entrance/exit 3a (schematically shown in FIG. 1 as well as FIG. 8) through which the set of five substrates 100 are carried together into the angle alignment device 3 and out of the angle alignment device 3. The five holding sections 10A to 10E are located to be apart from the substrate entrance/exit 3a in a carry-in direction X1 of the substrates 100. The carry-in direction X1 is defined as a direction crossing a vertical direction and is preferably a horizontal direction.

When the transfer robot 5 carries the five substrates 100 together into the angle alignment device 3, the hand 6 holding the five unaligned substrates 100 moves in the carry-in direction X1 into the angle alignment device 3 through the substrate entrance/exit 3a. The five holding sections 10A to 10E receive the five substrates 100 carried into the angle alignment device 3 in this way in a state in which the five substrates 100 are placed to be oriented horizontally and hold the received substrates 100 in a state in which the substrates 100 are arranged to be vertically spaced apart from each other. In the present embodiment, the five second support sections 12A to 12E which are at the second support positions and are not supporting the substrates 100 can also receive the five substrates 100 carried into the angle alignment device 3 in a state in which the five substrates 100 are placed to be oriented horizontally. After that, the five second support sections 12A to 12E are moved down to the second retracted positions, respectively, and thus the five unaligned substrates 100 can be transferred and loaded onto the holding sections 10A to 10E, respectively.

The angle alignment device 3 is configured to perform a series of angle alignment operations repeatedly in such a manner that the holding sections 10A to 10E are rotated together to perform the angle alignment of one of the substrates 100, and one of the first support sections 11A to 11E, corresponding to one of the holding sections 10A to 10E, which is holding the aligned substrate 100, is moved up to lift up the aligned substrate 100. The series of angle alignment operations are repeated until the angle alignment of all of the five substrates 100 is completed.

When the transfer robot 5 carries the five substrates 100 together out of the angle alignment device 3, the hand 6 holds the five aligned substrates 100 which are preparing for the carry-out, in the interior of the angle alignment device 3. In the present embodiment, the five second support sections 12A to 12E can prepare for the carry-out of the five aligned substrates 100, respectively, and the five holding sections 10A to 10E can also prepare for the carry-out of the five aligned substrates 100, respectively. After the series of angle alignment operations are completed, the second support sections 12A to 12E are moved up and thereby prepare for the carry-out of the five aligned substrates 100, or the first support sections 11A to 11E are moved down and thereby the five holding sections 10A to 10E prepare for the carry-out of the five aligned substrates 100. After the hand 6 holds the five substrates 100, the hand 6 exits in a carry-out direction X2 which is opposite to the carry-in direction X1. In this way, the five substrates 100 are carried together out of the angle alignment device 3 together with the hand 6, through the substrate entrance/exit 3a.

In accordance with the angle alignment device 3 of the present invention, while the five second support sections 12A to 12E are preparing for the carry-out of the five aligned substrates 100 carried thereinto, respectively, the five holding sections 10A to 10E can receive the five unaligned substrates 100, respectively. While the five holding sections 10A to 10E are preparing for the carry-out of the five aligned substrates 100 carried thereinto, respectively, the five second support sections 12A to 12E can receive the five unaligned substrates 100, respectively. In this way, the angle alignment device 3 can exchange one set of the five unaligned substrates 100 for one set of the five aligned substrates 100. As a result, as described above, the transfer efficiency of the substrates 100 and the operation efficiency of the angle alignment device 3 can be improved.

Hereinafter, the carry-in direction X1 and the carry-out direction X2 will be collectively referred to as "in/out direction X" when the carry-in direction X1 and the carry-out direction X2 are not distinguished from each other and indicated as one direction, and the "in/out direction X" is horizontal. A horizontal direction perpendicular to the "in/out direction X" will be referred to as a "perpendicular direction Y". To distinguish the five holding sections 10A to 10E arranged vertically from each other, the five holding sections 10A to 10E will be referred to as the holding section 10A at the first stage, the holding section 10B at the second stage, the holding section 10C at the third stage, the holding section 10D at the fourth stage, and the holding section 10E at the fifth stage, respectively, from the bottom to the top. The other elements corresponding to the holding sections 10A to 10E will be referred to in the same manner.

Figure 9:
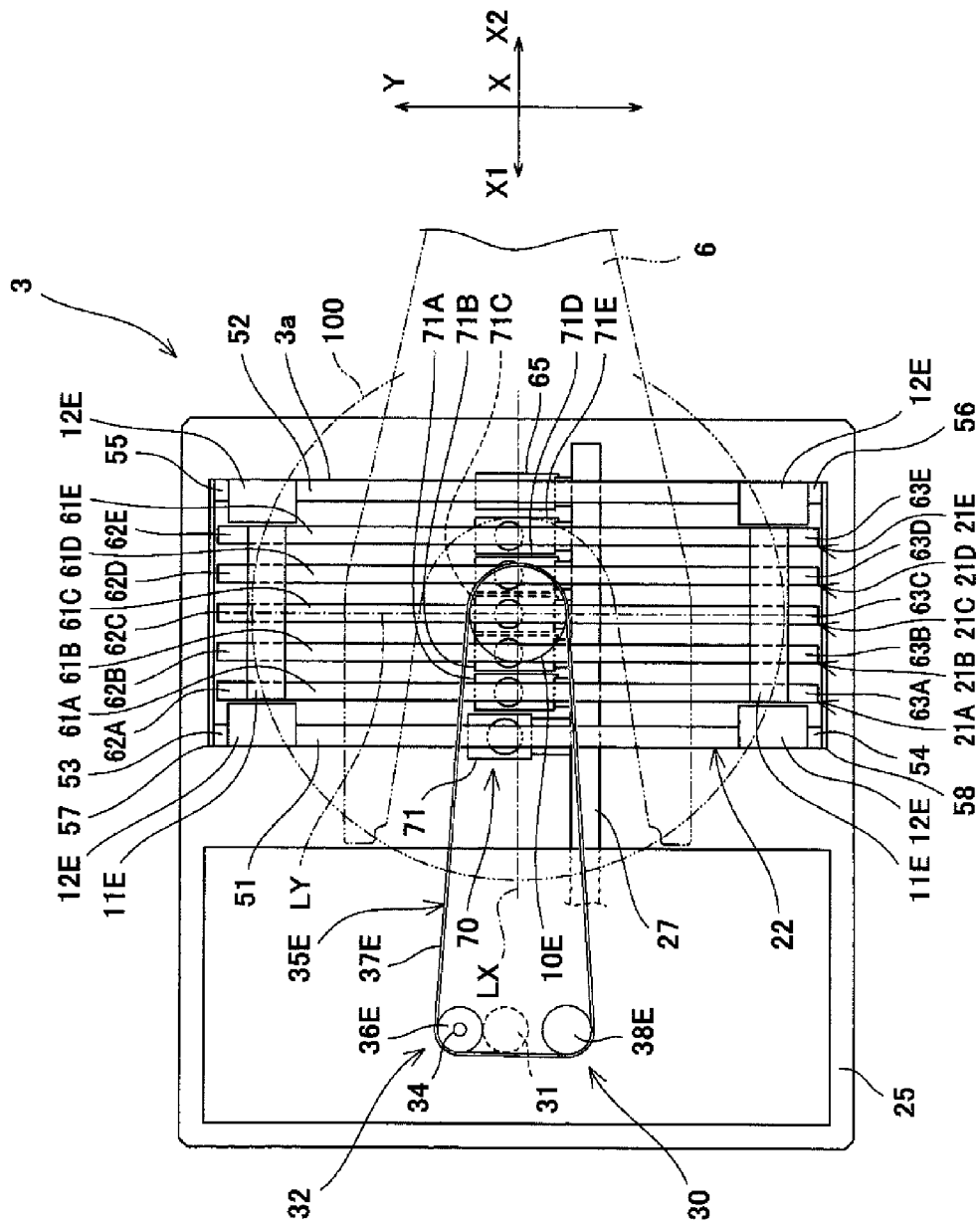
FIG. 9 is a plan view of the substrate angle alignment device of FIG. 8.

FIG. 9 is a plan view of the angle alignment device 3 of FIG. 8. As shown in FIGS. 8 and 9, the five holding sections 10A to 10E are driven to be rotated together by a rotation drive unit 30. The rotation drive unit 30 according to the present embodiment includes a single rotation drive source 31 such as an electric motor, and a rotation transmission mechanism 32 which transmits a driving force generated by the rotation drive source 31 to each of the plurality of holding sections 10A to 10E to rotate the five holding sections 10A to 10E together. The rotation transmission mechanism 32 includes a reduction gear mechanism 33, a drive shaft 34, and five belt transmission mechanisms 35A to 35E. The drive shaft 34 extends vertically and is rotatably supported. The drive shaft 34 is coupled to the output shaft of the rotation drive source 31 via the reduction gear mechanism 33. The five belt transmission mechanisms 35A to 35E correspond to the holding sections 10A to 10E, respectively. The belt transmission mechanisms 35A to 35E include drive pulleys 36A to 36E, respectively which are provided on the drive shaft 34 in such a manner that the drive pulleys 36A to 36E are rotatable together with the drive shaft 34, driven pulleys (not shown) contained in the corresponding holding sections 10A to 10E, respectively, and timing belts 37A to 37E wrapped around the drive pulleys 36A to 36E and driven pulleys, respectively. It should be noted that in the present embodiment, the timing belts 37A to 37E are also wrapped around idle pulleys 38A to 38E, respectively.

The holding sections 10A to 10E according to the present embodiment are turn tables which are rotatable around their center axes, respectively. The center axes extend vertically as in the drive shaft 34. The five center axes are coaxial with each other, and constitute a rotational axis common to the five holding sections 10A to 10E. When the rotation drive source 31 is actuated, the drive shaft 34 rotates around the axis extending vertically, and the five belt transmission mechanisms 35A to 35E transmit the rotation of the drive shaft 34 to the corresponding holding sections 10A to 10E, respectively. Thus, the five holding sections 10A to 10E are driven to be rotated together around their center axes (namely, the common rotational axis).

Each of the holding sections 10A to 10E has an upper surface of a substantially circular shape when viewed from above, on which one substrate 100 can be placed. Thus, the holding sections 10A to 10E hold the substrates 100, respectively, in a state in which the substrates 100 are placed on the upper surfaces, respectively. At this time, the substrates 100 are held on the corresponding holding sections 10A to 10E, respectively in such a manner that the center axes of the substrates 100 extending in a thickness direction thereof conform to the rotational axis of the holding sections 10A to 10E, respectively. The substrates 100 are held on the holding sections 10A to 10E, respectively, in such a manner that only the center portions of the substrates 100 are placed on the upper surfaces of the holding sections 10A to 10E, respectively, and the remaining portions of the substrates 100 protrude horizontally from the holding sections 10A to 10E, respectively. In a case where the substrates 100 are semiconductor wafers of a disc shape, the remaining portions of the substrates 100 extending from the holding sections 10A to 10E, respectively, have a ring shape when viewed from above. As described above and will be described later, the second support sections 12A to 12E can receive the substrates 100 carried thereinto, respectively, in a state in which the substrates 100 are placed to be oriented horizontally. At this time, also, the five substrates 100 can be aligned with respect to the rotational axis of the five holding sections 10A to 10E, respectively, in the above-described manner.

The drive shaft 34 is distant from the holding sections 10A to 10E in the carry-in direction X1. The drive shaft 34 is disposed on an opposite side of the substrate entrance/exit 3a in the in/out direction X, with respect to the holding sections 10A to 10E. In this configuration, the drive shaft 34 does not impede the entering operation and exiting operation of the hand 6 and the carry-in and carry-out of the substrates 100. The reduction gear mechanism 33 is coupled to the lower end of the drive shaft 34. The rotation drive source 31 is disposed below the drive shaft 34. In this configuration, the reduction gear mechanism 33 and the rotation drive source 31 do not interfere with the substrates 100. The rotation drive source 31 is disposed to be distant from the drive shaft 34 in the perpendicular direction Y. In this configuration, the rotation drive source 31 is laid out compactly in the in/out direction X, and hence the size of the angle alignment device 3 in the in/out direction X can be reduced.

Although not shown in detail, the holding sections 10A to 10E are mounted to the tip end portions of five brackets (not shown), respectively extending in the carry-out direction X2 from a support mount (not shown) extending upward from the base mount 25 and located adjacently to the drive shaft 34, and are rotatably supported on the base mount 25 side in a cantilever manner via the corresponding brackets, respectively. The upper surfaces of the holding sections 10A to 10E are located above the corresponding brackets, respectively, and above the corresponding timing belts 37A to 37E, respectively. In this configuration, the brackets and the rotation transmission mechanisms 32A to 32E do not interfere with the substrates 100, respectively.

Alternatively, depending on a change in the configurations of the holding sections 10A to 10E, or the like, other mechanisms may be used as the rotation transmission mechanism 32. For example, in a case where the holding sections have a pin shape or a claw shape, the rotation transmission mechanism may include a single turn table driven by a single rotation drive source, and a pole extending upward from the turn table, and the five holding sections may be placed on the pole in such a manner that the five holding sections are arranged to be vertically spaced apart from each other. Further, a plurality of rotation drive sources may be provided and synchronously operated to rotate the five holding sections together. By rotating the five holding sections 10A to 10E together by use of the single rotation drive source 31, like the present embodiment, the elements of the angle alignment device 3 can be reduced. As a result, the angle alignment device 3 which has a small size and a light weight can be manufactured at low cost.

As shown in FIG. 8, the first up-down units 21A to 21E are provided to correspond to the number (in the present embodiment, five) of the substrates 100 which can be handled together by the angle alignment device 3. The five first up-down units 21A to 21E correspond to the five first support sections 11A to 11E, respectively, in a one-to-one correspondence. The five first support sections 11A to 11E are mounted to the corresponding first up-down units 21A to 21E, respectively in such a manner that the first support sections 11A to 11E are arranged to be vertically spaced apart from each other, as in the holding sections 10A to 10E. Each of the first up-down units 21A to 21E is driven by an up-down drive unit 70, and is allowed to be moved vertically up and down independently of the remaining units. When one of the first up-down units 21A to 21E is moved up and down, only the corresponding one of the first support sections 11A to 11E is moved vertically up and down independently of the remaining sections. According to this up-down operation, only the substrate 100 held on one of the holding sections 10A to 10E can be lifted up by the corresponding one of the first support sections 11A to 11E, or the substrate 100 supported by one of the first support sections 11A to 11E can be transferred and loaded onto the corresponding one of the holding sections 10A to 10E.

The second up-down unit 22 is a single unit. The single second up-down unit 22 includes all of the five second support sections 12A to 12E. As in the holding sections 10A to 10E, the five second support sections 12A to 12E are arranged to be vertically spaced apart from each other in the second up-down unit 22. The second up-down unit 22 is driven by the up-down drive unit 70 to be moved up and down. When the second up-down unit 22 is moved up and down, the five second support sections 12A to 12E are vertically moved up and down together while maintaining a vertical spacing between adjacent ones of the second support sections 12A to 12E. According to this up-down operation, the five substrates 100 supported on the first support sections 11A to 11E, respectively, are lifted up together by the second support sections 12A to 12E, respectively, or the five substrates 100 supported on the second support sections 12A to 12E, respectively, can be transferred and loaded together onto the holding sections 10A to 10E, respectively.

Figure 10:
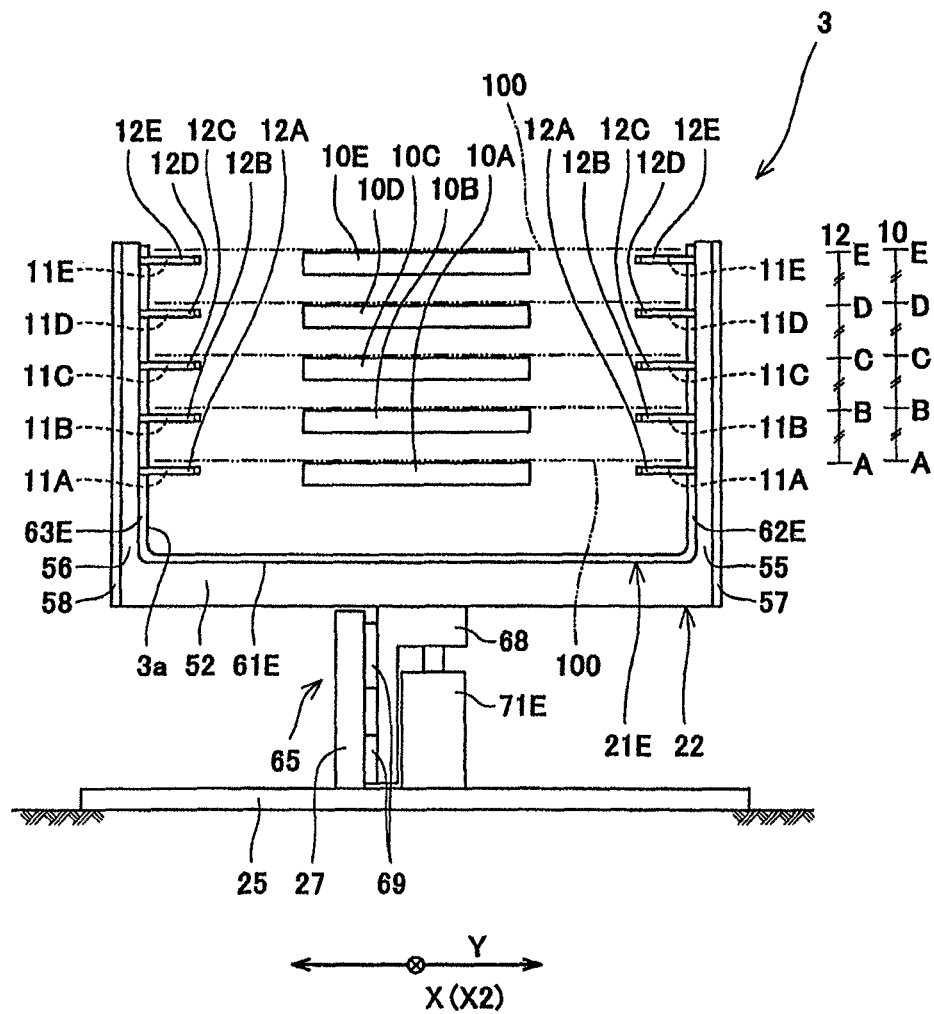
FIG. 10 is a front view of the substrate angle alignment device of FIG. 8.

FIG. 10 is a front view of the angle alignment device 3 of FIG. 8. As shown in FIGS. 8 to 10, the whole of the second up-down unit 22 constitutes a box unit which is opened on upper and lower sides and on both sides the in/out direction X. The second up-down unit 22 includes a pair of bases 51, 52, four poles 53 to 56, and a pair of side walls 57, 58. The pair of bases 51, 52 are disposed to be distant from each other in the in/out direction X and extend in parallel with the perpendicular direction Y. Among the four poles 53 to 56, the two poles 53, 54 extend vertically upward from the first end portion and second end portion of the base 51 on the carry-in side, while the two poles 55, 56 extend vertically upward from the first end portion and second end portion of the base 52 on the carry-out side. The pair of side walls 57, 58 are disposed in parallel with each other and to be distant from each other in the perpendicular direction Y. The side wall 57 located on a first side connects the first end portions of the bases 51, 52 to each other, and connects the poles 53, 55 located on the first side to each other. The side wall 58 located on a second side connects the second end portions of the two bases 51, 52 to each other, and connects the two poles 54, 56 located on the second side to each other. In this manner, the second up-down unit 22 constitutes the above-described box unit.

As shown in FIGS. 8 and 9, the five first up-down units 21A to 21E are arranged in the in/out direction X and collectively disposed within the inner region of the second up-down unit 22. Although the five first up-down units 21A to 21E are arranged in the carry-out direction X2 in the order of first to fifth stages, the order of the arrangement may be selected as desired.

Now, an attention is paid to the first up-down unit 21E at the fifth stage shown in FIG. 10 as well as FIGS. 8 and 9. The first up-down unit 21E includes a base 61E extending in the perpendicular direction, and a pair of poles 62E, 63E extending vertically upward from the first end portion and second end portion of the base 61E, respectively. The first up-down unit 21E has a U-shape as in the second up-down unit 22, when viewed in the in/out direction X. The size of the first up-down unit 21E is set to be smaller than that of the second up-down unit 22. This allows the first up-down unit 21E to be accommodated in the inner region of the second up-down unit 22. The base 61E is slightly shorter than the bases 51, 52 of the second up-down unit 22 and is disposed between the pair of side walls 57, 58 of the second up-down unit 22 (see in particular FIG. 9). The pair of poles 62E, 63E are disposed inward relative to the four poles 53 to 56 of the second up-down unit 22. The pair of poles 62E, 63E extend vertically and face the inner surfaces of the pair of side walls 57, 58 of the second up-down unit 22 (see in particular FIG. 9). In this way, the first up-down unit 21E at the fifth stage is nested into the second up-down unit 22.

The remaining first up-down units 21A to 21D are configured as in the first up-down unit 21E at the fifth stage and nested into the second up-down unit 22. The five bases 61A to 61E extend in parallel with each other within the inner region of the second up-down unit 22 (see in particular FIG. 9). On a first side in the perpendicular direction Y, the five poles 62A to 62E extend vertically and are arranged in the in/out direction X within the inner region of the second up-down unit 22 (the detail is not shown). On a second side in the perpendicular direction Y, the five poles 63A to 63E also extend vertically and are also arranged in the in/out direction X within the inner region of the second up-down unit 22 (see in particular FIG. 8). The five poles 63A to 63E have different heights corresponding to the heights of the corresponding holding sections 10A to 10E, respectively. The pole 63A at the first stage has a minimum height, while the pole 63E at the fifth stage has a maximum height (see in particular FIG. 8). The five poles 62A to 62E are equal in height to the corresponding poles 63A to 63E, respectively (the detail is not shown).

In the above-described configuration in which the five first up-down units 21A to 21E are arranged collectively within the inner region of the second up-down unit 22, it looks like a configuration in which the five bases 61A to 61E constitute the bottom wall of a draining board shape, and the five poles 62A to 62E on the first side and the five poles 63A to 63E on the second side constitute a pair of side walls of a bar-graph shape. The five first up-down units 21A to 21E constitute a basket-like unit or a box unit which is opened on the upper side and on the both sides in the in/out direction, as a whole. In other expressions, the five first up-down units 21A to 21E are obtained by slicing such a box unit in the in/out direction X. In this way, the five first up-down units 21A to 21E are combined and disposed within the inner region of the second up-down unit 22. Therefore, the up-down units 21A to 21E, 22 can be configured compactly as a whole.

A center wall 27 extends vertically upward from the base mount 25 and in the in/out direction X. The second up-down unit 22 is disposed above the center wall 27. The five first up-down units 21A to 21E are disposed within the inner region of the second up-down unit 22. The first up-down units 21A to 21E and the second up-down unit 22 are supported on the center wall 27 via guide support mechanisms 65 in such a manner that the first up-down units 21A to 21E and the second up-down unit 22 are movable up and down. The guide support mechanisms 65 correspond to the bases 51, 52, 61A to 61E. One guide support mechanism 65 is provided for each of the first up-down units 21A to 21E. Two guide support mechanisms 65 are provided for the second up-down unit 22 to correspond to the pair of bases 51, 52, respectively.

Now, an attention is paid to the carry-out side base 52 of the second up-down unit 22 shown in FIG. 10 as well as FIGS. 8 and 9. The base 52 is provided with a guide member 68 protruding downward. The guide member 68 is mounted to the side surface of the center wall 27 via a linear guide 69. The linear guide 69 serves to guide and support the guide member 68 so that the guide member 68 is linearly moved vertically along the side surface of the center wall 27. Although the detail is not shown, the carry-in side base 51 of the second up-down unit 22 is supported on the center wall 27 in the same manner, and the bases 61A to 61E of the first up-down units 21A to 21E are supported on the center wall 27 in the same manner.

As described above, the second up-down unit 22 constitutes the box unit which is opened on the lower side. This allows the five first up-down units 21A to 21E to protrude the corresponding guide members (the detail is not shown) downward farther than the second up-down unit 22 does, via the lower opening of the second up-down unit 22. In this configuration, the five first up-down units 21A to 21E are nested into the second up-down unit 22 and supported on the center wall 27 located below the second up-down unit 22.

As shown in FIGS. 8 and 9, the five first up-down units 21A to 21E and the single second up-down unit 22 are driven by the up-down drive unit 70. The up-down drive unit 70 includes five first up-down drive sources 71A to 71E which correspond to the five first up-down units 21A to 21E, respectively, and move up and down the corresponding first up-down units 21A to 21E, respectively, and a second up-down drive source 72 which moves up and down the second up-down unit 22. In the present embodiment, the second up-down drive source 72 is a single drive source. The six up-down drive sources 71A to 71E, 72 are installed on the base mount 25 in a state in which the up-down drive sources 71A to 71E, 72 are arranged in the in/out direction X, and disposed below the corresponding up-down units 21A to 21E, 22, respectively.

The first up-down drive sources 71A to 71E are cylinders including, for example, rods capable of being extended and contracted vertically. The rods are coupled to the bases 61A to 61E or the guide members of the guide support mechanisms 65, respectively. When the rod of each of the first up-down drive sources 71A to 71E is extended, the corresponding one of the first up-down units 21A to 21E is guided by the guide support mechanism 65, and is moved up independently of the remaining ones of the first up-down units 21A to 21E. According to this up-movement, the corresponding one of the first support sections 11A to 11E included in the first up-down units 21A to 21E is moved up independently of the remaining ones of the first support sections 11A to 11E. On the other hand, when the rod of one of the first up-down drive sources 71A to 71E is contracted, the corresponding one of the first up-down units is moved down independently of the remaining ones of the first up-down units, and the corresponding one of the first support sections is moved down independently of the remaining ones of the first support sections. As a matter course, if all of the five first up-down drive sources 71A to 71E are synchronously operated, then the five first up-down units 21A to 21E can be moved up and down together, and thereby the five first support sections 11A to 11E can be moved up and down together.

As described above, the second up-down unit 22 constitute a box unit which is opened on the lower side to form the lower opening. In this structure, when the first up-down units 21A to 21E are moved up, the elements (e.g., the rods) of the first up-down drive sources 71A to 71E can be moved into the inner region of the second up-down unit 22 through the lower opening of the second up-down unit 22. This makes it possible to install in a simple manner the five first up-down drive sources 71A to 71E on the base mount 25 in such a manner that the five first up-down drive sources 71A to 71E are disposed below the second up-down unit 22 while the five first up-down units 21A to 21E are nested into the second up-down unit 22.

As in the first up-down drive sources 71A to 71E, the second up-down drive source 72 is a cylinder. The rod of the second up-down drive source 72 is coupled to the carry-in side base 51 or the guide member (the detail is not shown) of the corresponding guide support mechanism 65. When the rod of the second up-down drive source 72 is extended, the second up-down unit 22 is guided to be moved up by the guide support mechanism 65. According to this up-movement, the five second support sections 12A to 12E included in the second up-down unit 22 are moved up together. On the other hand, when the second up-down drive source 72 is retracted, the second up-down unit 22 is moved down and the five second support sections 12A to 12E are moved down together. The carry-out side base 52 is supported on the side surface of the center wall 27 via the guide support mechanism 65 in such a manner that the carry-out side base 52 is movable up and down. Therefore, even in the case where the second up-down drive source 72 is a single unit and a driving force for the up-down movement is input to only the carry-in side base 51, the second up-down unit 22 can be smoothly moved vertically without changing the posture of the second up-down unit 22.

The up-down drive sources 71A to 71E, 72 may be configured to generate a rotational driving force like an electric motor. In this case, the up-down drive unit may include a conversion mechanism for converting a rotation generated by an up-down drive source into a translational motion, and for example, a ball screw and a nut which is threadingly engageable with the ball screw may be used as the conversion mechanism.

As shown in FIGS. 8 to 10, the second up-down unit 22 is disposed above the base mount 25 and constitutes a box unit which is opened on the upper and lower sides and on the both sides in the in/out direction. The five first up-down units 21A to 21E are collectively disposed within the inner region of the second up-down unit 22. The lower opening portion of the second up-down unit 22 allows the first up-down units 21A to 21E to be nested into the second up-down unit 22, and the first up-down drive sources 71A to 71E to be installed on the base mount 25 in such a manner that the first up-down units 21A to 21E are supported on the base mount side.

The five first up-down units 21A to 21E constitute the box unit as a whole, which is opened on the upper side and on the both sides in the in/out direction. The five holding sections 10A to 10E are disposed within the inner region of the five first up-down units 21A to 21E. The bases 51, 52, 61A to 61E of the first up-down units 21A to 21E are located above the base mount 25 and below the holding section 10A at the first stage (lowermost stage) and extend in the perpendicular direction Y.

When the second up-down unit 22 is viewed in the carry-in direction X1, the carry-out side base 52 and the two poles 55, 56 extending vertically upward from the base 52 are configured to form a U-shape, and the five first up-down units 21A to 21E are configured to form a U-shape in the same manner at a location that is away on the carry-in side in the in/out direction X, from the second up-down unit 22 (see in particular in FIG. 10). The five holding sections 10A to 10E are disposed at a location that is away on the carry-in side in the in/out direction X, from the five first up-down units 21A to 21E. The five holding sections 10A to 10E are arranged vertically between the poles 62A to 62E and the poles 63A to 63E in the perpendicular direction Y.

The first up-down units 21A to 21E and the second up-down unit 22 are opened on the carry-out side in the in/out direction X as described above, and this opening portion on the carry-out side constitutes the substrate entrance/exit 3a through which the substrates 100 are carried into and out of the angle alignment device 3. The hand 6 can move in the carry-in direction X1 into the inner regions of the first up-down units 21A to 21E through the substrate entrance/exit 3a and move in the carry-out direction X2 out of the first up-down units 21A to 21E and the second up-down unit 22 through the substrate entrance/exit 3a (see in particular FIG. 9).

While the holding sections 10A to 10E are holding the substrates 100 of a disc shape, only the center portions of the substrates 100 are placed on the upper surfaces of the holding sections 10A to 10E, respectively, and the remaining portions of the substrates 100 protrude horizontally from the holding sections 10A to 10E, respectively, and have a ring-shape when viewed from above. The bases 61A to 61E of the first up-down units 21A to 21E are shorter than the bases 51, 52 of the second up-down unit 22 and longer than the diameter of the substrates 100. This makes it possible to carry the substrates 100 into the first up-down units 21A to 21E, respectively, as described above, without interference between the substrates 100 and the up-down units 21A to 21E, 22. In a state in which the substrates 100 carried into the first up-down units 21A to 21E are held on the five holding sections 10A to 10E, respectively, the held substrates 100 face the poles 62A to 62E and 63A to 63E of the first up-down units 21A to 21E, forming gaps with the poles 62A to 62E and 63A to 63E.

As shown in FIG. 9, the drive shaft 34 is disposed to be distant in the carry-in direction X1 from the second up-down unit 22, together with the rotation drive source 31. For this reason, the drive shaft 34 does not impede the carry-out or carry-in of the substrates 100. The first up-down units 21A to 21E and the second up-down unit 22 constitute a box unit which is opened on the carry-in side in the in/out direction X. The belt transmission mechanisms 35A to 35E extend in the carry-out direction X2 from an outside region of the second up-down unit 22 into the inner regions of the five first up-down units 21A to 21E through the opening portion on the carry-in side. Since the up-down units 21A to 21E, 22 are opened in this way, the drive shaft 34 extending vertically can be disposed outside the up-down units 21A to 21E, 22, and the mechanisms 36A to 36E for rotating the holding sections 10A to 10E inside the up-down units 21A to 21E, 22 by utilizing the rotation of the drive shaft 34 can be disposed. In addition, the up-down units 21A to 21E, 22 are also opened on the carry-out side, and this opening portion serves as the substrate entrance/exit 3a. With these configurations, the whole of the rotation drive unit 30 can be disposed not to impede the carry-out or carry-in of the substrates 100.

As shown in FIG. 8, the first up-down units 21A to 21E include the first support sections 11A to 11E, respectively, in a one-to-one correspondence. The first support sections 11A to 11E are secured to the poles 62A to 62E and 63A to 63E, of the corresponding first up-down units 21A to 21E, respectively. In the first up-down units 21A to 21E, the poles 62A, 63A, the poles 62B, 63B, the poles 62C, 63C, the poles 62D, 63D, and the poles 62E, 63E form pairs, respectively. Each of the first support sections 11A to 11E forms a pair.

Now, an attention is paid to the first up-down unit 21E at the fifth stage. As shown in FIG. 10, the first support sections 11E at the fifth stage form a pair in the perpendicular direction Y. The pair of first support sections 11E have a flat plate claw shape. The pair of first support sections 11E are attached to the pair of poles 62E, 63E of the corresponding first up-down unit 21E, and disposed to sandwich the corresponding holding section 10E therebetween in the perpendicular direction Y. The pair of first support sections 11E are disposed to be equal in height on the basis of the base 61E of the corresponding first up-down unit 21E in such a manner that the first support sections 11E are substantially equal in height to the corresponding holding section 10E.

As shown in FIG. 9, the substrate 100 held on the holding section 10E extends horizontally from the holding section 10. The edge portion of the substrate 100 on the first side in the perpendicular direction Y is slightly apart from the poles 62A to 62E of the first up-down units 21A to 21E and the poles 53, 55 of the second up-down unit 22. The edge portion of the substrate 100 on the second side in the perpendicular direction Y is slightly apart from the poles 63A to 63E of the first up-down units 21A to 21E and the poles 54, 56 of the second up-down unit 22.

The pair of first support sections 11E protrude in the perpendicular direction Y from the corresponding poles 62E, 63E, respectively, and are disposed in the inner regions of the first up-down units 21A to 21E. The first support section 11E on the first side in the perpendicular direction Y do not overlap with the holding section 10E when viewed from above, and overlaps with the edge portion on the first side of the substrate 100 held on the holding section 10E when viewed from above. Likewise, the first support section 11E on the second side in the perpendicular direction Y do not overlap with the holding section 10E when viewed from above, and overlaps with the edge portion on the second side of the substrate 100 held on the holding section 10E when viewed from above.

When a reference line LY extending in the perpendicular direction Y through the center of the holding section 10E when viewed from above is drawn, the reference line LY extends through the pair of first support sections 11E and the pair of first support sections 11E are provided on the reference line LY. In a state in which the substrate 100 is properly held on the holding section 10E, the reference line LY conforms to a center line of the substrate 100 extending through the center of the substrate 100 and in the perpendicular direction Y. In this case, the regions of the pair of first support sections 11E which overlap with the substrate 100 include a terminal point of the substrate 100 on the first side in the perpendicular direction Y and a terminal point of the substrate 100 on the second side in the perpendicular direction Y.

In particular, in the present embodiment, when viewed from above, the pair of first support sections 11E are disposed to be line-symmetric with respect to a reference line LX as a symmetric axis extending through the center of the holding section 10E and in the in/out direction X. In a state in which the substrate 100 is properly held on the holding section 10E, the reference line LX conforms to a center line of the substrate 100 extending through the center of the substrate 100 and in the in/out direction X. Each of the pair of first support sections 11E is line-symmetric with respect to the reference line LY as a symmetric axis when viewed from above. Therefore, in a relation between the pair of first support sections 11E and the substrate 100, the regions of the pair of first support sections 11E which overlap with the substrate 100 are provided to be line-symmetric with respect to the reference line (center line) LX and to be line-symmetric with respect to the reference line (center line) LY.

Each of the pair of first support sections 11E is short in the perpendicular direction Y and elongated in the in/out direction X when viewed from above. Therefore, in a relation between the pair of first support sections 11E and the substrate 100, the regions of the pair of first support sections 11E which overlap with the substrate 100 are only the regions which are in the vicinity of the edge of the substrate 100 in the radial direction of the substrate 100, and are the regions which are relatively large in the circumferential direction of the substrate 100. The end portion on the carry-out side of each of the pair of first support sections 11E is located on a position at which the pole (62E, 63E) of the first up-down unit (the first up-down unit 21E at the fifth stage in the present embodiment) at the terminal end on the carry-out side is disposed, while the end portion on the carry-in side of each of the pair of first support sections 11E is located on a position at which the pole (62A, 63A) of the first up-down unit (the first up-down unit 21A at the first stage in the present embodiment) at the terminal end on the carry-in side is disposed. In brief, the pair of first support sections 11E are disposed at first and second end portions in the perpendicular direction Y and extend over the entire region in the in/out direction X, within the inner region of the five first up-down units 21A to 21E.

The remaining first support sections 11A to 11D are configured as in the first support section 11E at the fifth stage. As described above, the heights of the poles 62A to 62E, 63A to 63E of the first up-down units 21A to 21E are different from each other so as to correspond to the vertical positions of the corresponding holding sections 10A to 10E, respectively. The first support sections 11A to 11E are attached to the upper end portions of the corresponding poles 62A to 62E, 63A to 63E. In this configuration, the vertical size of the first up-down unit corresponding to the holding section at the lower stage is reduced, which can reduce the weight of the angle alignment device 3.

The five first support sections 11A to 11E are disposed to perfectly overlap with each other when viewed from above. In other words, the first support sections 11A to 11E are disposed at the first and second end portions in the perpendicular direction Y and extend over the entire region in the in/out direction X, within the inner regions of the five first up-down units 21A to 21E in the above-described manner, irrespective of the positions of the corresponding first up-down units 21A to 21E in the in/out direction X. Therefore, in a relation between each of the five substrates 100 and the corresponding one of the first support sections 11A to 11E, the regions of the five substrates 100 which overlap with the corresponding five first support sections 11A to 11E, when viewed from above, are set in the same manner.

As shown in FIG. 9, the second up-down unit 22 includes five second support sections 12A to 12E. The five second support sections 12A to 12E are secured to the poles 53 to 56 of the second up-down unit 22, respectively, and are disposed to be vertically spaced apart from each other. The second support sections 12A to 12E are disposed to be substantially equal in height to the corresponding holding sections 10A to 10E, respectively. Vertical spacings each of which is between adjacent ones of the holding sections 10A to 10E are equal to each other. Vertical spacings each of which is between adjacent ones of the second support sections 12A to 12E are also equal to each other. The vertical spacings of the second support sections 12A to 12E are equal to the vertical spacings of the holding sections 10A to 10E, respectively (see dimension lines on the right side in FIG. 10).

The second up-down unit 22 includes the four poles 53 to 56. Each of the second support sections 12A to 12E includes four claw-shaped support elements (second support sections) secured to the four poles 53 to 56, respectively, in such a manner the four support elements are equal in height to each other, and disposed at four separate locations, respectively. More specifically, each of the second support sections 12A to 12E includes two sets of claw-shaped support elements in such a manner that the two sets are distant from each other in the perpendicular direction Y. The set on the first side in the perpendicular direction Y is composed of the two claw-shaped support elements forming a pair in the in/out direction X. The set on the second side in the perpendicular direction Y is composed of the two claw-shaped support elements forming a pair in the in/out direction X. When viewed from another side, each of the second support sections 12A to 12E includes two sets of claw-shaped support elements in such a manner that the two sets are distant from each other in the in/out direction X, the set on the carry-in side in the in/out direction X is composed of the two claw-shaped support elements forming a pair in the perpendicular direction Y, and the set on the carry-out side in the in/out direction X is composed of the two claw-shaped support elements forming a pair in the perpendicular direction Y.

Now, an attention is paid to the second support section 12E at the fifth stage. As shown in FIG. 9, the set of the second support section 12E on the first side in the perpendicular direction Y includes a pair of second support sections 12E (claw-shaped support elements) which are apart from each other in the in/out direction X. This pair of second support sections 12E are secured to the poles 53, 55, respectively, of the second up-down unit 22. These second support sections 12E protrude in the perpendicular direction Y from the corresponding poles 53, 55, respectively and are disposed in the inner region of the second up-down unit 22. These second support sections 12E do not overlap with the corresponding holding section 10E and the corresponding first support section 11E when viewed from above, and overlap with the edge portion on the first side of the substrate 100 held on the holding section 10E when viewed from above. These second support sections 12E are disposed to be substantially equal in height to the corresponding first support section 11E and to sandwich therebetween in the in/out direction X the first support section 11E located on the same side (on the first side in the perpendicular direction Y). The regions of these second support sections 12E which overlap with the substrate 100 are located on the carry-in side and the carry-out side in the in/out direction X, respectively, relative to the region of the first support section 11E located on the same side which overlaps with the substrate 100, and form a pair.

The set on the second side in the perpendicular direction Y have the same configuration. The pair of second support sections 12E included in the set on the second side are located to sandwich therebetween in the in/out direction X the first support section 11E located on the same side (on the second side in the perpendicular direction Y), of the corresponding first support sections 11E, do not overlap with the corresponding holding section 10E and the corresponding first support section 11E when viewed from above, and overlap with the edge portion located on the second side of the substrate 100 held on the holding section 10E when viewed from above. The regions of these second support sections 12E which overlap with the substrate 100 are set to sandwich therebetween in the in/out direction X the region of the first support section 11E on the second side which overlaps with the substrate 100. As a result, the substrate 100 overlaps with the second support sections 12E, at four separate locations, respectively.

In particular, in the present embodiment, in both of the set on the first side in the perpendicular direction Y and the set on the second side in the perpendicular direction Y, the two second support sections 12E are disposed to be line-symmetric with respect to the above-described reference line LY as a symmetric axis. Also, the two second support sections 12E included in the set on the first side in the perpendicular direction Y is disposed to be line-symmetric with the two second support sections 12E included in the set on the second side in the perpendicular direction Y, with respect to the above-described reference line LX as a symmetric axis. Therefore, in a relation between the substrate 100 and the second support sections 12E, the four regions of the second support sections 12E which overlap with the substrate 100 are set to be line-symmetric with respect to the reference line (center line)LX as the symmetric axis and to be line-symmetric with respect to the reference line (center line)LY as the symmetric axis.

The remaining second support sections 12A to 12D are configured as in the second support section 12E at the fifth stage. The five second support sections 12A to 12E are disposed to perfectly overlap with each other when viewed from above. Therefore, in a relation between each of the five substrates 100 and the corresponding one of the five second support sections 12A to 12E, the regions of the substrate 100 which overlap with the corresponding first support sections 11A to 11E when viewed from above are configured in the same manner.

Figure 11:
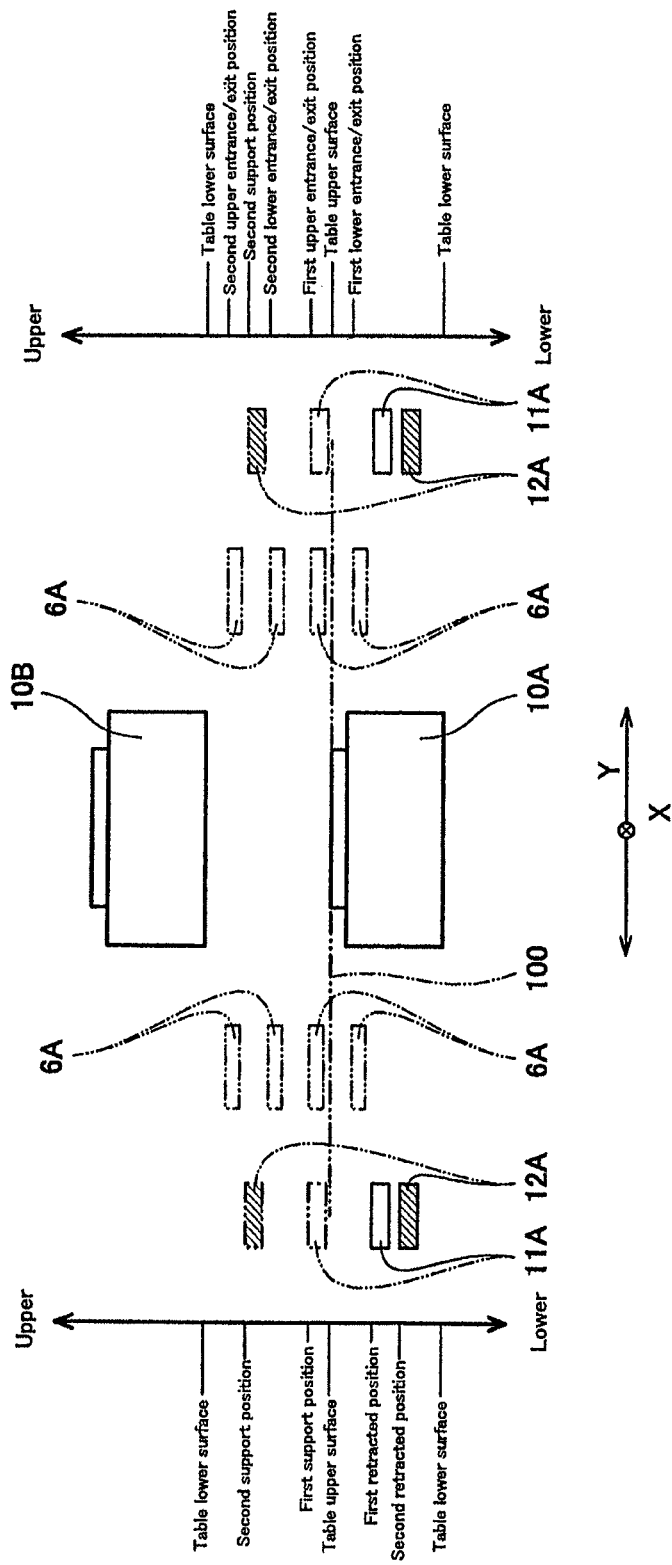
FIG. 11 is a schematic view showing a positional relationship among a holding section, first support sections and second support sections of FIGS. 8 to 10, when viewed in an in/out direction of the substrates.

FIG. 11 is a schematic view showing a positional relationship among the holding section 10A, the first support sections 11A and the second support sections 12A of FIGS. 8 to 10, when viewed in the in/out direction X. Although FIG. 11 shows the positional relationship between the holding section 10A at the first stage and the corresponding elements, the same positional relationship applies to the remaining holding sections 10B to 10E.

As shown in FIG. 11, the first support sections 11A are moved up and down between a first retracted position that is below the substrate 100 held on the corresponding holding section 10A and a first support position that is above the corresponding holding section 10A, according to the up-down movement of the corresponding first up-down unit 21A (see FIG. 8).

When the first support sections 11A are moved up from the first retracted position to the first support position in a state in which the substrate 100 is held on the holding section 10A, the substrate 100 held on the holding section 10A can be lifted up by the first support sections 11A, and thus the substrate 100 is transferred from the upper surface of the holding section 10A and loaded onto the upper surfaces of the first support sections 11A. Since the first support sections 11A overlap with the substrate 100 when viewed from above, in the above-described manner, the first support sections 11A can suppress a rotation moment around the axis in the in/out direction X and a rotation moment around the axis in the perpendicular direction Y from acting on the substrate 100. This allows the substrate 100 to be supported on the first support sections 11A in a well-balanced manner.

When the first support sections 11A are moved down from the first support position to the first retracted position in a state in which the substrate 100 is supported on the first support sections 11A, the substrate 100 supported on the first support sections 11A is placed on the upper surface of the holding section 10A, and the first support sections 11A are further moved down. This allows the substrate 100 to be transferred from the first support sections 11A and loaded onto the holding section 10A.

The second support sections 12A are moved up and down between a second retracted position that is below the substrate 100 held on the corresponding holding section 10A and a second support position that is above the first support position of the corresponding first support sections 11A.

When the second support sections 12A are moved up from the second retracted position to the second support position in a state in which the substrate 100 is supported on the first support sections 11A, the supported substrate 100 can be lifted up on the second support sections 12A. Thereby, the substrate 100 is transferred and loaded onto the upper surfaces of the second support sections 12A. The substrate 100 is supported at four points on the second support sections 12A. As described above, the second support sections 12A overlap with the substrate 100 when viewed from above. This allows the substrate 100 to be supported on the second support sections 12A in a well-balanced manner, as in the first support sections 11A.

When the second support sections 12A are moved down from the second support position to the second retracted position in a state in which the substrate 100 is supported on the second support sections 12A and the first support sections 11A are located at the first retracted position, the substrate 100 supported on the second support sections 12A are placed on the upper surface of the holding section 10A, and the second support sections 12A are further moved down. This allows the substrate 100 to be transferred from the second support sections 12A and loaded onto the holding section 10A.

It should be noted that in a case where the second support sections 12A are moved up from the second retracted position to the second support position in a state in which the substrate 100 is held on the holding section 10A, the substrate 100 held on the holding section 10A can be lifted up by the second support sections 12A. Also, in a case where the second support sections 11A are moved down from the second support position to the second retracted position in a state in which the substrate 100 is supported on the second support sections 12A and the first support sections 11A are located at the first support position, the substrate 100 supported on the second support sections 12A can be transferred and loaded onto the first support sections 11A. However, such a transfer method is not employed in a substrate angle alignment method which will be described later.

The holding section 10A, the corresponding first support sections 11A, and the corresponding second support sections 12A are disposed in such a manner that they do not overlap with each other when viewed from above. In this structure, even when the first support sections 11A are moved up and down while crossing the upper surface level of the holding section 10A, the substrate 100 can be transferred and loaded between the first support sections 11A and the holding section 10A without interference of the first support sections 11A with the holding section 10A. Also, even when the second support sections 12A are moved up and down while crossing the upper surface level of the holding section 10A and the first support position level of the first support sections 11A, the substrate 100 can be transferred and loaded among the holding section 10A, the first support sections 11A and the second support sections 12A without interference of the second support sections 12A with the holding section 10A and the first support sections 11A.

The second support position is below the lower surface of the holding section 10B which is higher than the corresponding holding section 10A by one stage. In this configuration, when the substrate 100 is lifted up by the second support sections 12A, this substrate 100 does not collide against the holding section 10B which is higher by one stage. It is sufficient that the first retracted position and the second retracted position are below the upper surface of the corresponding holding section 10A. The first retracted position and the second retracted position may be above the lower surface of the corresponding holding section 10A. Although in the example FIG. 9, the second retracted position is below the first retracted position for the sake of simpler illustration, the second retracted position may be as high as the first retracted position, or above the first retracted position in the vertical direction.

With reference to FIG. 11, the holding section 10A can receive the unaligned substrate 100 carried thereinto and held on the corresponding hand 6A, hold the aligned substrate 100, and prepare for the carry-out of the aligned substrate 100. The second support sections 12A located at the second support position can receive the unaligned substrate 100 carried thereinto, support the aligned substrate 100, and prepare for the carry-out of the aligned substrate 100.

When the substrate 100 is carried into the holding section 10A, the hand 6A moves in the carry-in direction X into the angle alignment device 3, at a first upper entrance/exit position that is above the upper surface of the holding section 10A, and moves down to a first lower entrance/exit position that is below the upper surface of the holding section 10A. This allows the substrate 100 held on the hand 6A to be transferred and loaded onto the upper surface of the holding section 10A. After that, the hand 6A moves in the carry-out direction X2 and exits the angle alignment device 3, and thus the carry-in of the substrate 100 to the holding section 10A is completed. When the substrate 100 held on the holding section 10A is carried out of the holding section 10A, the hand 6A moves into the angle alignment device 3 at a first lower entrance/exit position, and moves up to the first upper entrance/exit position. This allows the substrate 100 held on the holding section 10A to be transferred and loaded onto the hand 6A. After that, the hand 6A moves in the carry-out direction X2 and exits the angle alignment device 3, and thus the carry-out of the substrate 100 from the holding section 10A is completed.

When the substrate 100 is carried into the second support sections 12A, the hand 6A moves in the carry-in direction X into the angle alignment device 3, at a second upper entrance/exit position that is above the second support position and below the lower surface of the holding section 10A which is higher by one stage, and moves down to a second lower entrance/exit position that is below the second support position. This allows the substrate 100 held on the hand 6A to be transferred and loaded onto the second support sections 12A. After that, the hand 6A moves in the carry-out direction X2 and exits the angle alignment device 3, and thus the carry-in of the substrate 100 to the holding section 10A is completed. When the substrate 100 supported on the second support sections 12A is carried out of the second support sections 12A, the hand 6A moves into the angle alignment device 3, at the second lower entrance/exit position and moves up to the second upper entrance/exit position. This allows the substrate 100 supported on the second support sections 12A to be transferred and loaded onto the hand 6A. After that, the hand 6A moves in the carry-out direction X2 and exits the angle alignment device 3, and thus the carry-out of the substrate 100 from the second support sections 12A is completed.

The holding section 10A is the turn table on which the center portion of the substrate 100 is placed. The first support sections 11A are disposed to sandwich the holding section 10A in the perpendicular direction Y, and the second support sections 12A are disposed to sandwich the holding section 10A in the perpendicular direction Y. As described above, the hand 6A includes the pair of tip end portions which are fork portions. The hand 6A moves into and out of the angle alignment device 3 in a state in which the pair of tip end portions are apart from each other in the perpendicular direction Y. In this configuration, the hand 6 can be disposed within the angle alignment device 3 in such a manner that the pair of tip end portions sandwich therebetween the holding section 10A in the perpendicular direction Y, the tip end portion on the first side in the perpendicular direction Y is located between the holding section 10A, and the support sections 11A, 12A on the first side, the tip end portion on the second side in the perpendicular direction Y is located between the holding section 10A, and the support sections 11A, 12A on the second side. This allows the hand 6A to move up and down without interference with the holding section 10A, and the support sections 11A, 12A.

Figure 12:
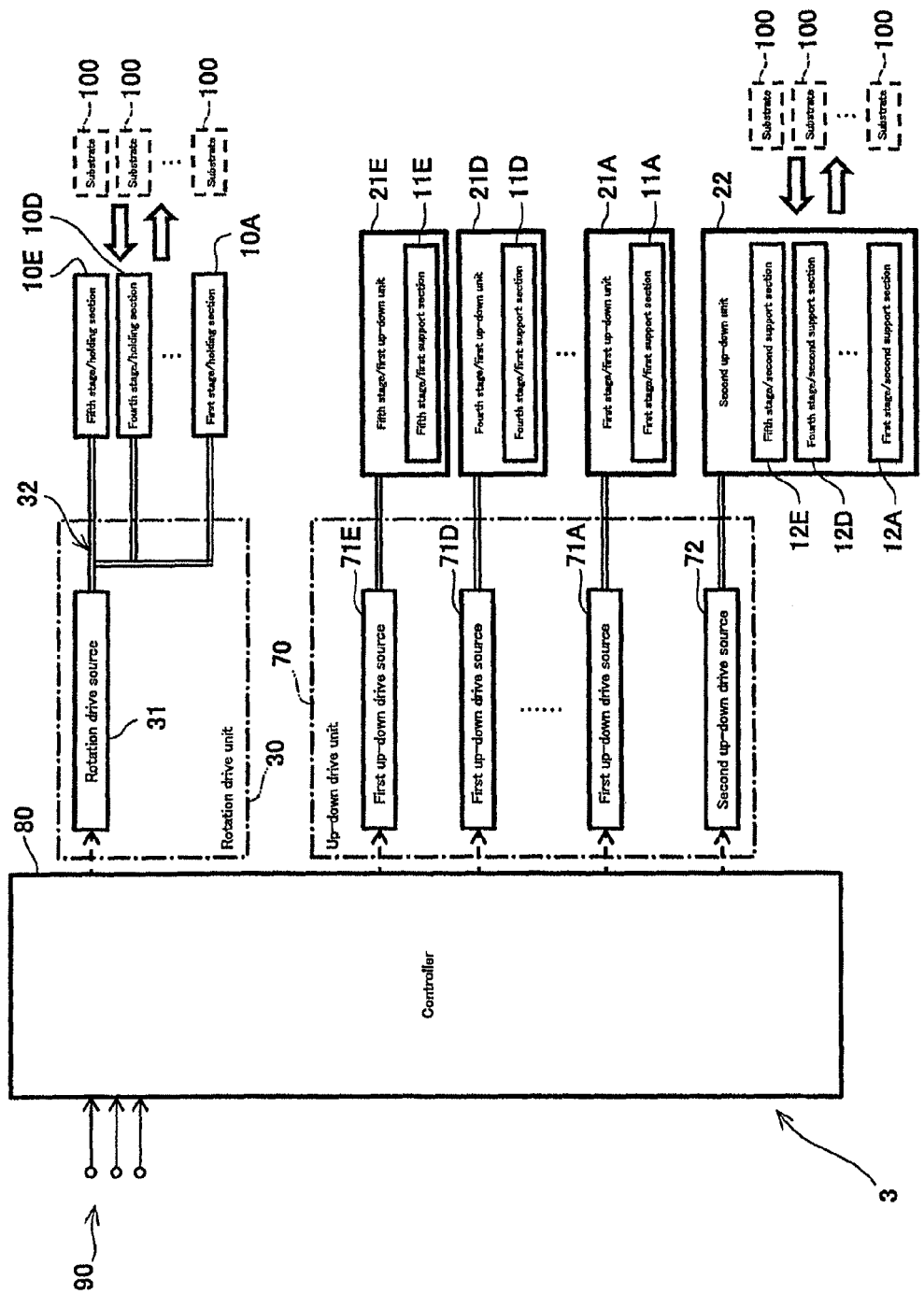
FIG. 12 is a block diagram showing the configuration of the substrate angle alignment device of FIG. 8.

FIG. 12 is a block diagram showing the configuration of the angle alignment device 3 of FIG. 8. As shown in FIG. 12, the angle alignment device 3 includes a controller 80 which controls the rotation drive unit 30 and the up-down drive unit 70, and sensors 90 connected to the input side of the controller 80. The controller 80 executes a pre-stored program indicating a procedure of the substrate angle alignment method, and controls the rotation drive source 31, the five first up-down drive sources 71A to 71E, and the second up-down drive source 72, based on inputs from the sensors 90. This allows the rotation drive unit 30 and the up-down drive unit 70 to perform the angle alignment operation for the five substrates 100 carried into the angle alignment device 3. This also allows the up-down drive unit 70 to perform the transfer/loading operation for the five substrates 100 carried into the angle alignment device 3. The sensors 90 include a substrate presence/absence sensor for detecting whether or not the five substrates 100 are present within the first up-down units 21A to 21E, respectively, a substrate angle sensor for detecting the circumferential positions (angular positions) of the substrates 100 within the first up-down units 21A to 21E, and the like. Based on the inputs from these sensors, the angle alignment operation and the transfer/loading operation are performed.

Figure 13:
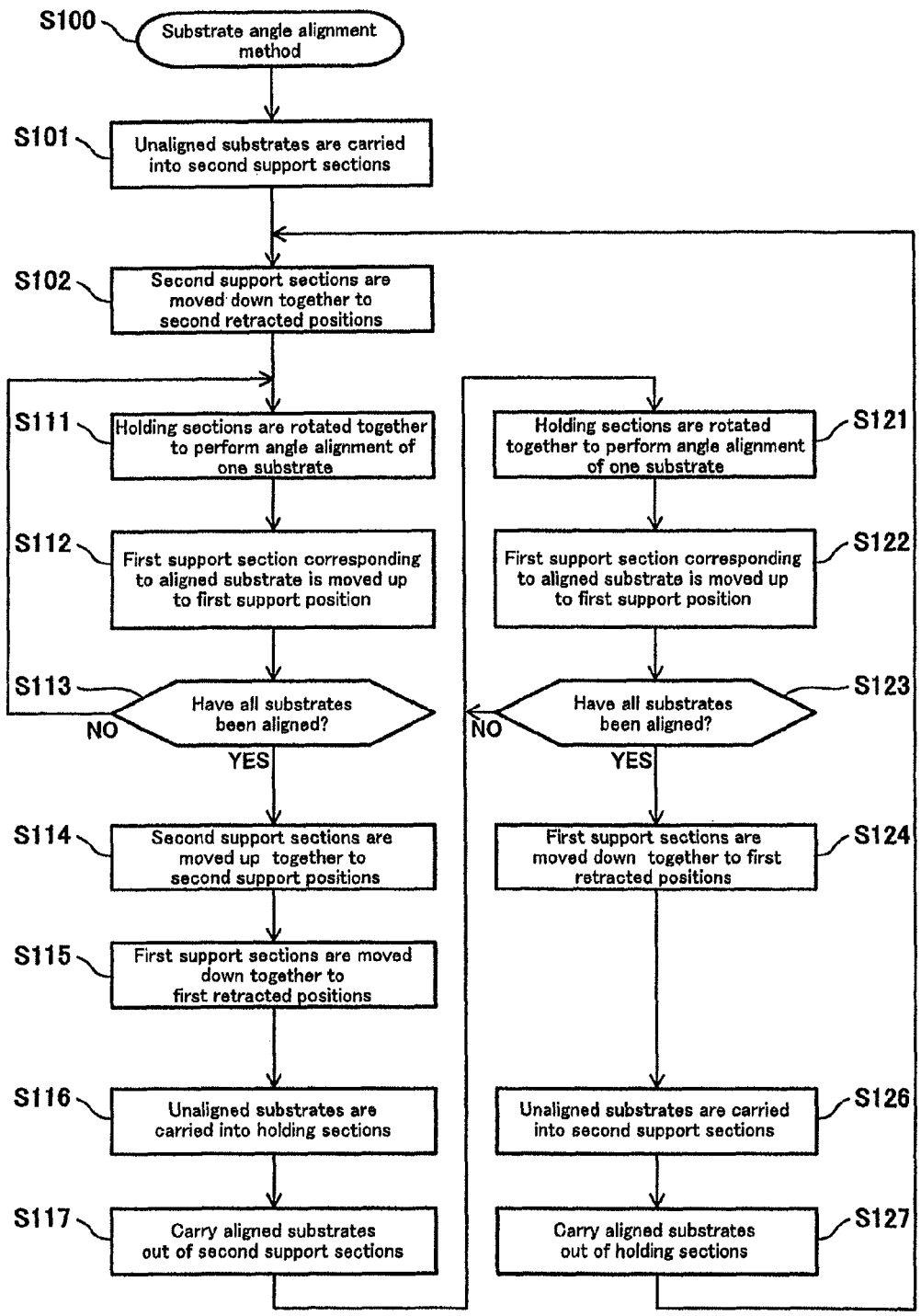
FIG. 13 is a flowchart showing the flow of the steps of a substrate angle alignment method according to Embodiment 1, which is performed in the substrate angle alignment device of FIG. 8.
Figure 14:
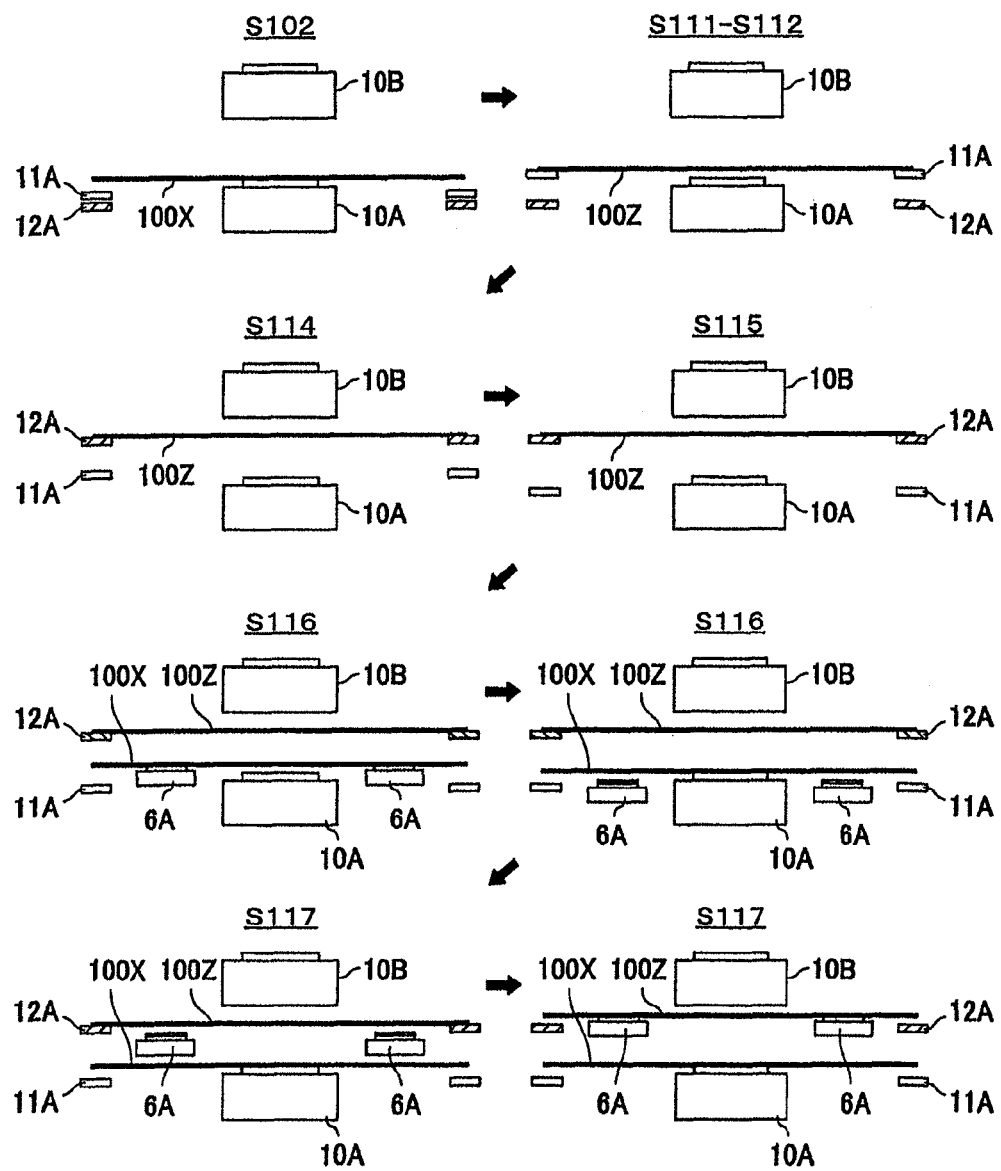
FIG. 14 is a view showing a change in the positions of the first support sections, a change in the positions of the second support sections, and a change in the states of the substrates, in a case where the substrate angle alignment method of FIG. 13 is performed.

FIG. 13 is a flowchart showing the flow of the steps of the substrate angle alignment method S100 according to Embodiment 1, which is performed in the angle alignment device 3 of FIG. 8. FIG. 14 is a view showing a change in the positions of the first support sections 11A, a change in the positions of the second support sections 12A, and a change in the states of the substrates 100, in a case where the substrate angle alignment method S100 of FIG. 13 is performed. FIG. 14 shows the changes corresponding to the steps of the former half part (S102, S111 to S117) of the steps of FIG. 13. Although FIG. 14 exemplarily shows the holding section 10A, the first support sections 11A, and the second support sections 12A which are located at the first stage, the sections at the other stages operate in the same manner. The rotation of the holding sections 10A to 10E, the up-down movement of the first support sections 11A to 11E, and the up-down movement of the second support sections 12A to 12E are performed under control of the rotation drive unit 30 and the up-down drive unit 70, by the controller 80.

However, this control will not be described below. In the description below, when the unaligned substrate and the aligned substrate are distinguished from each other, "X" and "Z" will be attached to the reference symbol of the unaligned substrate and the reference symbol of the aligned substrate, respectively.

As shown in FIG. 13, for easier understanding of the description, in the substrate angle alignment method S100 of the present embodiment, initially, the five substrates 100X are carried into the second support sections 12A to 12E, respectively (S101). In the carry-in at this time, the five first support sections 11A to 11E are located at the first support positions, respectively, and the five second support sections 12A to 12E are located together at the second support positions, respectively.

In this case, then, as shown in FIGS. 13 and 14, the five second support sections 12A to 12E are moved down together from the second support positions to the first retracted positions (S102). This allows the five substrates 100X to be transferred and loaded together onto the five holding sections 10A to 10E, respectively. When the five substrates 100X are held on the five holding sections 10A to 10E, respectively, the series of angle alignment operations (S111 to S112) are sequentially performed in repetition.

Figure 15:
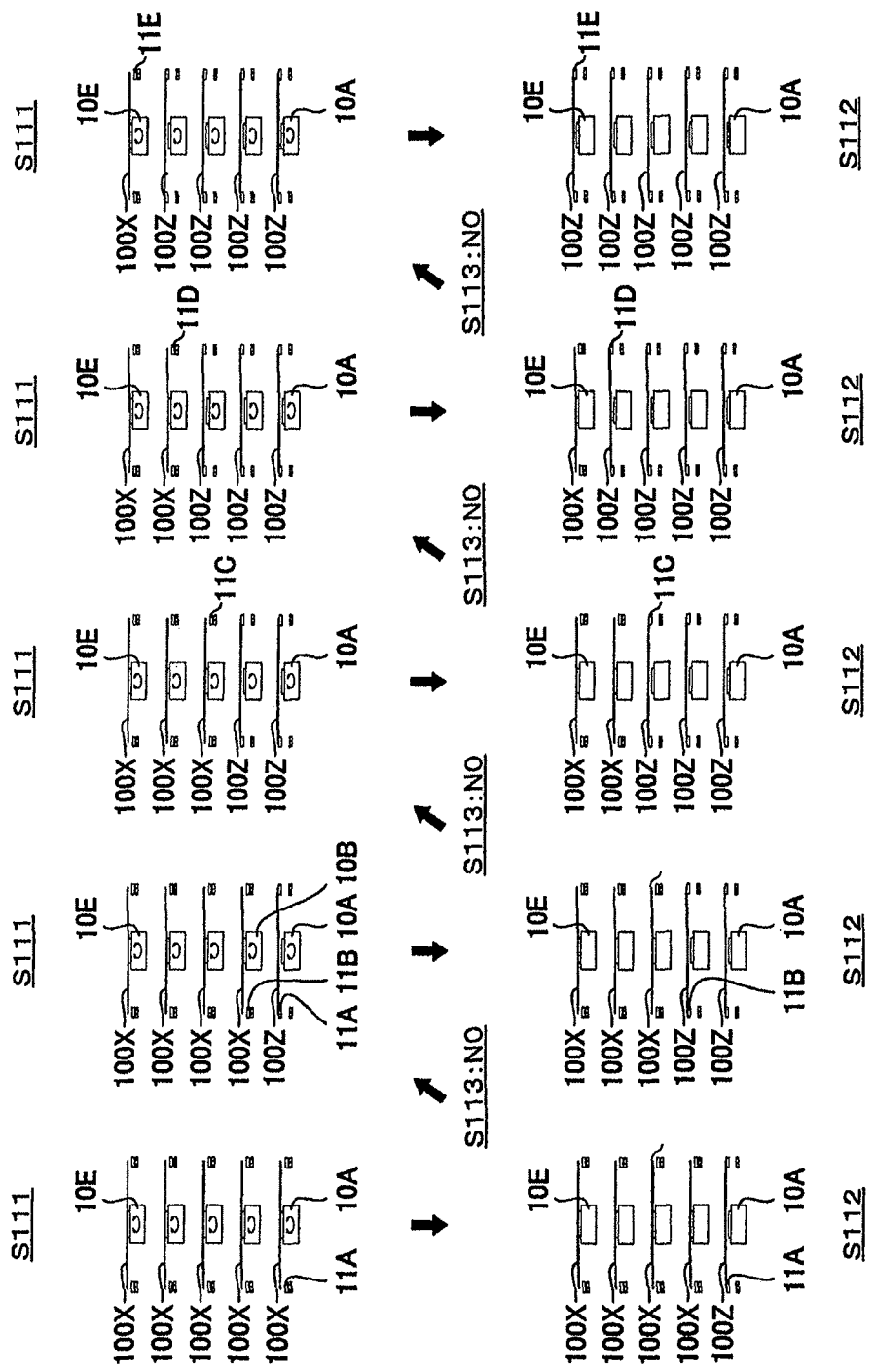
FIG. 15 is a view showing a change in the positions of the first support sections and a change in the states of the substrates in a case where a series of angle alignment operations of FIG. 14 are performed.

FIG. 15 is a view showing a change in the positions of the first support sections 11A to 11E and a change in the states of the substrates 100 in a case where the series of angle alignment operations (S111 to S112) of FIG. 14 are performed. As shown in FIGS. 13 to 15, in the angle alignment operations, the holding sections 10A to 10E are rotated together, and the angle alignment of one substrate 100 (in the illustrated example, the substrate 100 held on the holding section 10A at the first stage) selected from among the five substrates 100 is performed (S111). Then, the first support sections (in the illustrated example, the first support sections 11A at the first stage) corresponding to the aligned substrate 100Z are independently moved up from the first retracted position to the first support position (S112). At this time, the remaining first support sections 11B to 11E remain stopped. This allows the one aligned substrate 100Z to be moved away from the holding section 10A and lifted up by the first support sections 11A.

When the angle alignment operations for one of the five substrates 100 is completed (S13: NO), the series of angle alignment operations (S111 to S112) for one substrate (in the illustrated example, the substrate 100X held on the holding section 10B at the second stage) selected from among the remaining unaligned substrates 100X are performed. The series of angle alignment operations (S111 to S112) are repeated while selecting the substrate 100 in succession. Normally, the series of angle alignment operations are repeated until all of the substrates 100 are lifted up by the first support sections 11A to 11E, respectively. In the angle alignment operations for the second and following substrates 100, when the angle alignment of the selected one substrate 100 is performed, the five holding sections 10A to 10E are rotated together. However, the aligned substrate 100Z is away from the corresponding holding section, and therefore, the aligned state of the aligned substrate 100Z can be maintained. Although in the example of FIG. 15, the five substrates 100 sequentially undergo the angle alignment one by one from the bottom to the top, the order of the angle alignment may be suitably changed.

As shown in at the right end portion of FIG. 15, when all of the five first support sections 11A to 11E are located the first support positions, respectively, the vertical spacings each of which is between adjacent ones of the five first support sections 11A to 11E are equal to each other. The vertical spacings of the first support sections 11A to 11E are equal to those of the second support sections 12A to 12E and those of the holding sections 10A to 10E. In the present embodiment, the five first support sections 11A to 11E independently lift up the substrates 100Z in such a manner that the five first support sections 11A to 11E correspond to the five first up-down units 21A to 21E, respectively, in a one-to-one correspondence. Therefore, pitches can be equalized. Since the specified first support section can be moved up and down independently irrelevantly to the positions of the remaining first support sections, it is sufficient that the first support position has a requisite minimum height for lifting up the substrate 100Z. This makes it possible to reduce the vertical spacings of the holding sections 10A to 10E, and hence the size of the angle alignment device 3 in the vertical direction.

As shown in FIGS. 13 and 14, when the angle alignment of all of the substrates 100Z is completed (S113:YES), the five second support sections 12A to 12E are moved up together from the second retracted positions to the second support positions (S114). This allows the five substrates 100Z to be transferred and loaded together onto the five second support sections 12A to 12E, respectively (first transfer/loading operation). When the first transfer/loading operation is performed in this way, the five second support sections 12A to 12E located at the second support positions can prepare for the carry-out of the five aligned substrates 100Z, respectively, and the five holding sections 10A to 10E which are empty can receive the five unaligned substrates 100X carried thereinto, respectively, as will be described below.

Before the carry-in of the substrates 100X, the five first support sections 11A to 11E are moved down together from the first support positions to the first retracted positions (S115). After the five first support sections 11A to 11E have been moved down together, the hands 6A to 6E are permitted to move into the angle alignment device 3, and carry the five unaligned substrates 100X into the five holding sections 10A to 10E, respectively (S116). At this time, the hands 6A to 6E hold the five unaligned substrates 100X, respectively, and move into the carry-in direction X1 at the first upper entrance/exit positions (see the third view from the top, at the left side of FIG. 14). After that, the hands 6A to 6E move from the first upper entrance/exit positions to the first lower entrance/exit positions. This allows the five unaligned substrates 100X to be transferred and loaded onto the five holding sections 10A to 10E, respectively (see the third view from the top, at the right side of FIG. 14).

The first support sections 11A to 11E are moved down together in order to prepare for the angle alignment operations performed for the substrates 100 which are newly carried into the angle alignment device 3. The first support sections 11A to 11E overlap with the substrates 100 when viewed from above. In this configuration, if the first support sections 11A to 11E are moved down after the substrates 100 have been carried into the holding sections 10A to 10E, respectively, the first support sections 11A to 11E interfere with the substrates 100, respectively. In the present embodiment, the first support sections 11A to 11E are moved down before the substrates 100 are carried into the holding sections 10A to 10E, respectively. Therefore, even when the first support sections 11A to 11E are incapable of circumventing the substrates 100, next angle alignment operations can be prepared by merely moving down the first support sections 11A to 11E.

After the carry-in of the substrates 100X has ended, the five aligned substrates 100Z are carried out of the five second support sections 12A to 12E, respectively (S117). At this time, the hand 6 exits the angle alignment device 3 once. Outside the angle alignment device 3, the hand 6 moves up from the first lower entrance/exit position to the second lower entrance/exit position, and then moves in the carry-in direction X1 into the angle alignment device 3 at the second lower entrance/exit position (see the fourth view from the top, at the left side of FIG. 14). After that, the hands 6A to 6E move up from the second lower entrance/exit positions to the second upper entrance/exit positions. This allows the five aligned substrates 100Z to be transferred and loaded onto the five hands 6A to 6E, respectively (see the fourth view from the top, at the right side of FIG. 14). Then, the hand 6 moves in the carry-out direction X2 and exits the angle alignment device 3. In this way, the first exchange step S1 (see FIGS. 3 and 4) of the substrate transfer method S0 (see FIGS. 3 and 4) is performed.

Figure 16:
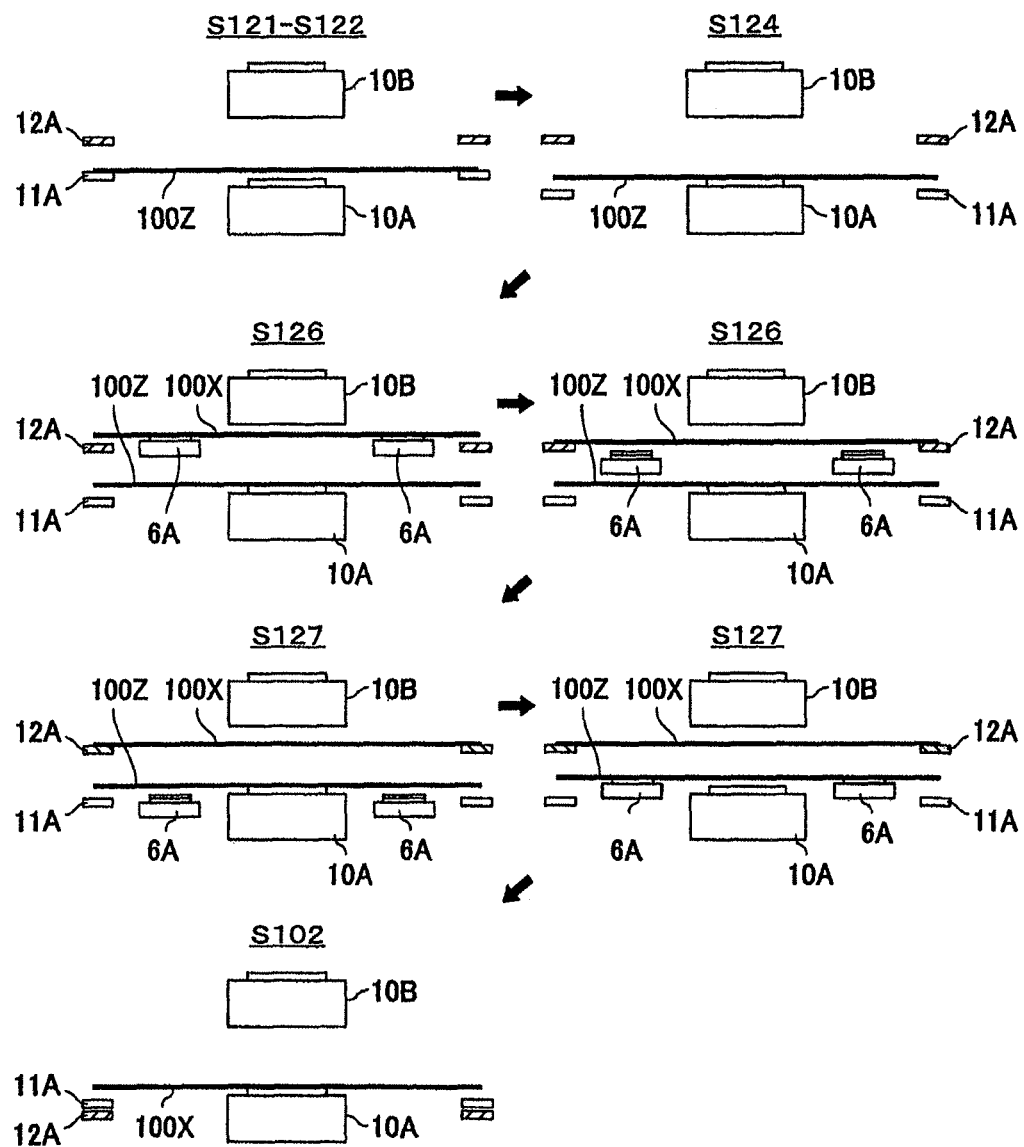
FIG. 16 is a view showing a change in the positions of the first support sections, a change in the positions of the second support sections, and a change in the states of the substrates, in a case where the substrate angle alignment method of FIG. 13 is performed.

FIG. 16 is a view showing a change in the positions of the first support sections 11A, a change in the positions of the second support sections 12B, and a change in the states of the substrates 100, in a case where the substrate angle alignment method S100 of FIG. 13 is performed. FIG. 16 shows the changes corresponding to the latter half part (S121 to S127, S102) of the steps of FIG. 13.

Figure 17:
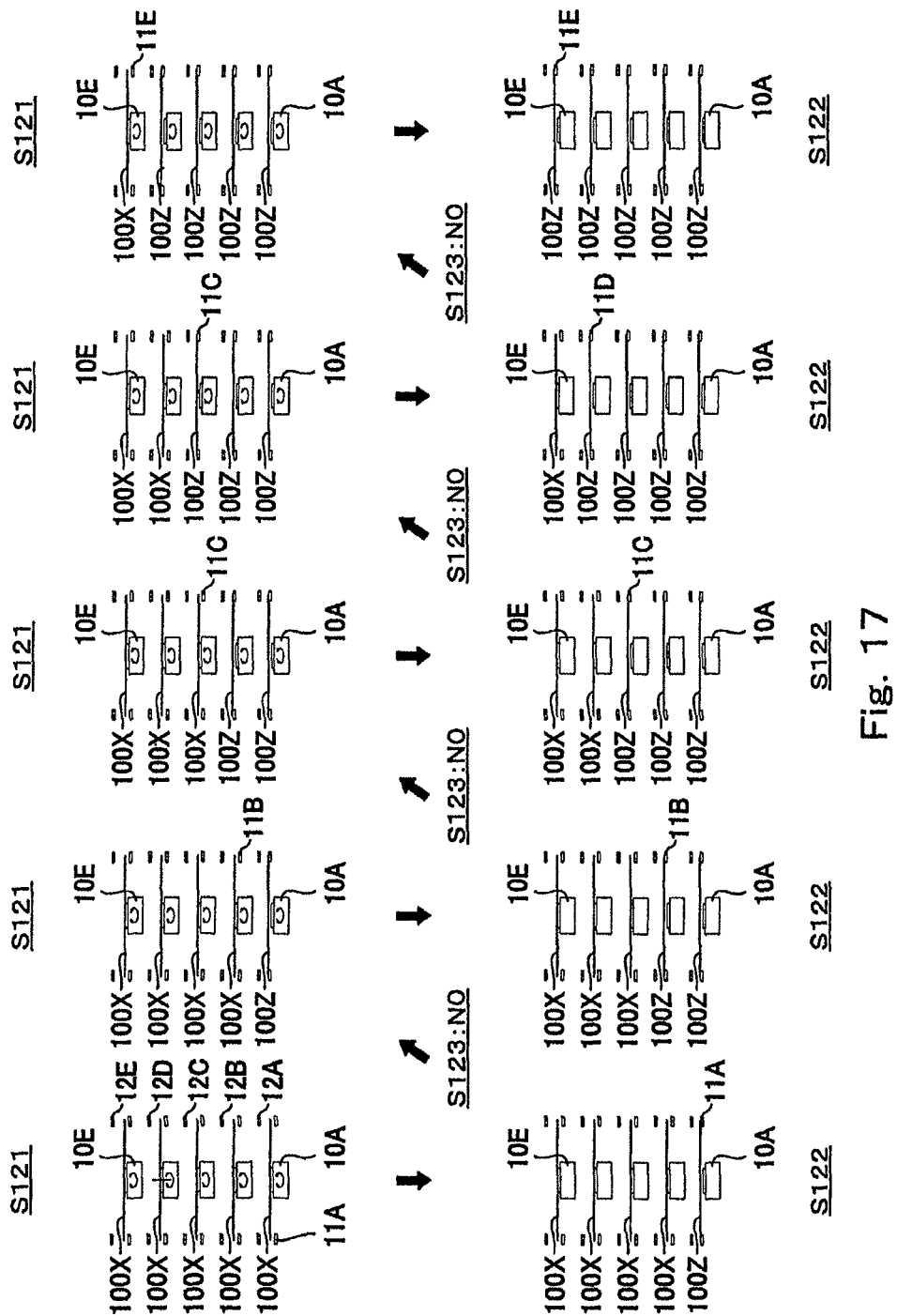
FIG. 17 is a view showing a change in the positions of the first support sections and a change in the states of the substrates in a case where a series of angle alignment operations of FIG. 16 are performed.

As shown in FIGS. 13 and 16, after the substrates 100X have been carried into the holding sections 10A to 10E, respectively, and the substrates 100Z have been carried out of the second support sections 12A to 12E, the series of angle alignment operations are repeated as described above (S121 to S122). As shown in FIG. 17, the series of angle alignment operations in this case are different from those in a previous case in that the second support sections 12A to 12E are located at the second support positions, respectively, and are the same as those in the previous case in the operations of the holding sections 10A to 10E, and the operations of the first support sections 11A to 11E.

As shown in FIGS. 13 and 16, when the angle alignment of all of the five substrates 100X is completed, and the aligned substrates are lifted up by the first support sections 11A to 11E, respectively (S123: YES), the first support sections 11A to 11E are moved down together from the first support positions to the first retracted positions (S124). This allows the five substrates 100Z to be transferred together from the first support sections 11A to 11E and loaded together onto the holding sections 10A to 10E, respectively (second transfer/loading operation). By performing the second transfer/loading operation, the holding sections 10A to 10E can prepare for the carry-out of the substrates 100Z, and the second support sections 12A to 12E located at the second support positions can prepare for the carry-in of the five substrates 100X. While the series of angle alignment operations (S121 to S122) are repeated and the second transfer/loading operation (S124) is performed, the second support sections 12A to 12E continue to be located at the second support positions, respectively. Since the substrates 100 are aligned or transferred and loaded at locations that are below the second support positions, respectively, the second support sections 12A to 12E need not be moved and do not affect the change in the states of the substrates 100 or the like at all, even in a state in which the second support sections 12A to 12E continue to be located at the second support positions.

After the second transfer/loading operation has been performed, the five substrates 100X are carried into the second support sections 12A to 12E, respectively, located at the second support positions (S126), and the five substrates 100Z are carried out of the five holding sections 10A to 10E, respectively (S127).

As shown in FIG. 16, to carry the substrates 100X into the second support sections 12A to 12E, respectively, the hands 6A to 6E holding the substrates 100X, respectively, move into the angle alignment device 3 at the second upper entrance/exit positions and move down together to the second lower entrance/exit positions, and the substrates 100X are transferred and loaded onto the second support sections 12A to 12E, respectively. Thereby, the carry-in of the substrates 100X to the second support sections 12A to 12E is completed. Then, the hands 6A to 6E move in the carry-out direction X2 and exit the angle alignment device 3 once. Outside the angle alignment device 3, the hands 6A to 6E move down together to the first lower entrance/exit positions, and move into the angle alignment device 3 at the first lower entrance/exit positions. Then, the hands 6A to 6E move up to the first upper entrance/exit positions, the substrate 100Z are transferred from the holding sections 10A to 10E and loaded onto the hands 6A to 6E, respectively, and the hands 6A to 6E exit in the carry-out direction X2. Thereby, the carry-out of the substrates 100Z from the holding sections 10A to 10E is completed.

When the carry-out of the substrates 100Z from the holding sections 10A to 10E is completed as described above, the second support sections 12A to 12E are moved down together from the second support positions to the second retracted positions, in order to prepare for the angle alignment operations for the substrates 100X having been carried into the second support sections 12A to 12E, respectively (S102). This allows the five substrates 100X supported on the second support sections 12A to 12E, respectively to be transferred and loaded onto the five holding sections 10A to 10E, respectively. After that, as described above, the angle alignment operations (S111 to S112) are repeated, and the first transfer/loading operation (S114) is performed. Since the second support sections 12A to 12E are moved down to the second retracted positions, respectively in step S102, the second support sections 12A to 12E can prepare for the first transfer/loading operation. The second support sections 12A to 12E are moved down after the substrates 100 have been carried out of the holding sections 10A to 10E, respectively. Therefore, even when the second support sections 12A to 12E are incapable of circumventing the substrates 100, the second support sections 12A to 12E can be moved down straight to the second retracted positions, respectively, without interference with the substrates 100.

As should be appreciated from the above, in accordance with the above-described substrate angle alignment method S100 according to the present embodiment, the aligned substrates 100Z are returned to their carry-in location. The carry-in location of the substrates 100 is switched between holding sections 10A to 10E and the second support sections 12A to 12E located at the second support positions in an alternate manner, and correspondingly, the carry-out location of the substrates 100 is switched in an alternate manner. This allows the second support sections 12A to 12E to receive the unaligned substrates 100X carried thereinto, while preparing for the carry-out of the aligned substrates 100Z, without a need for the second support sections 12A to 12E to include a particular structure for circumventing the substrates 100. Therefore, the first exchange step S1 (see FIGS. 3 and 4) of the substrate transfer method S0 can be performed.

Figure 18:
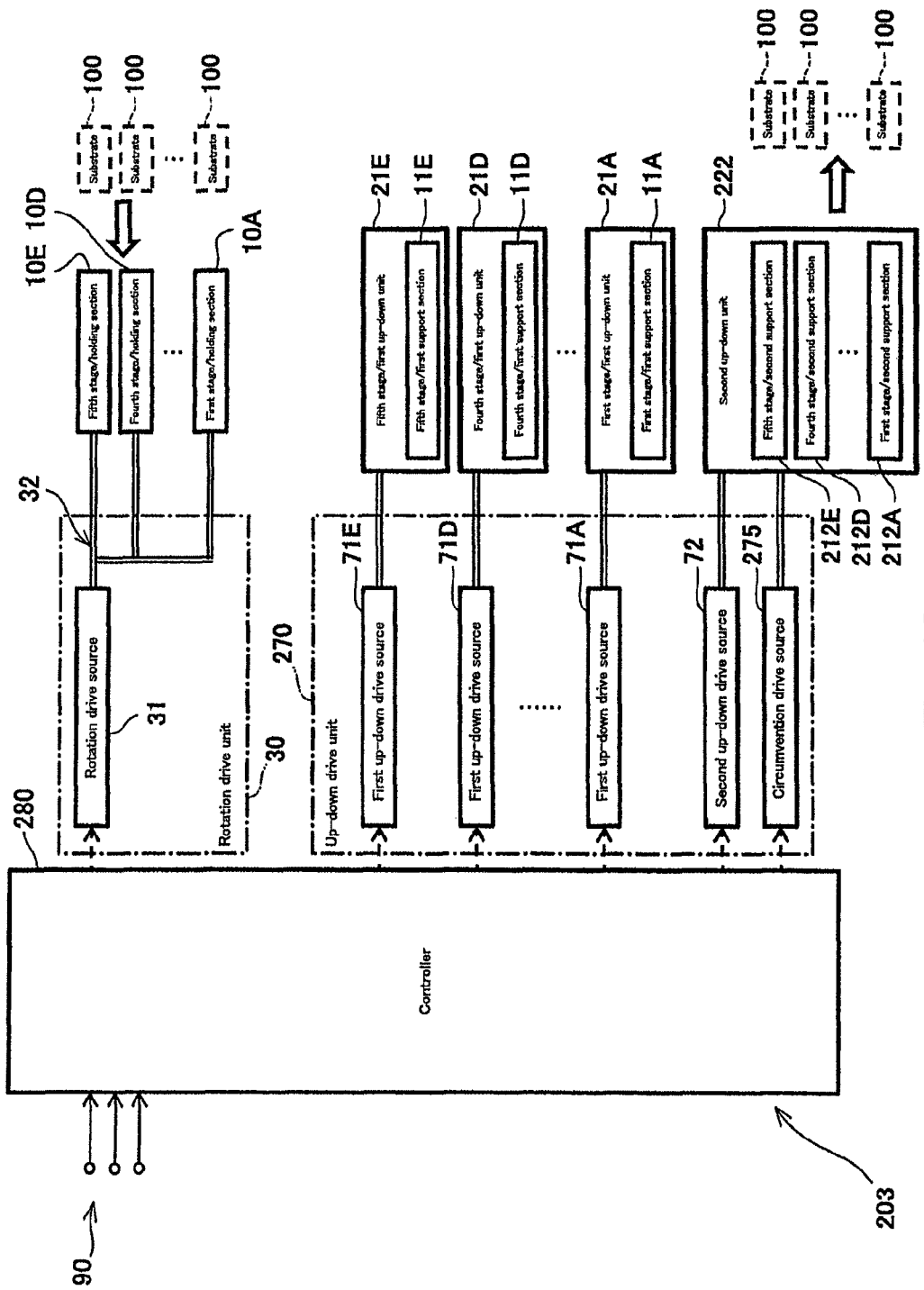
FIG. 18 is a block diagram showing the configuration of an angle alignment device according to Embodiment 2.
Figure 19:
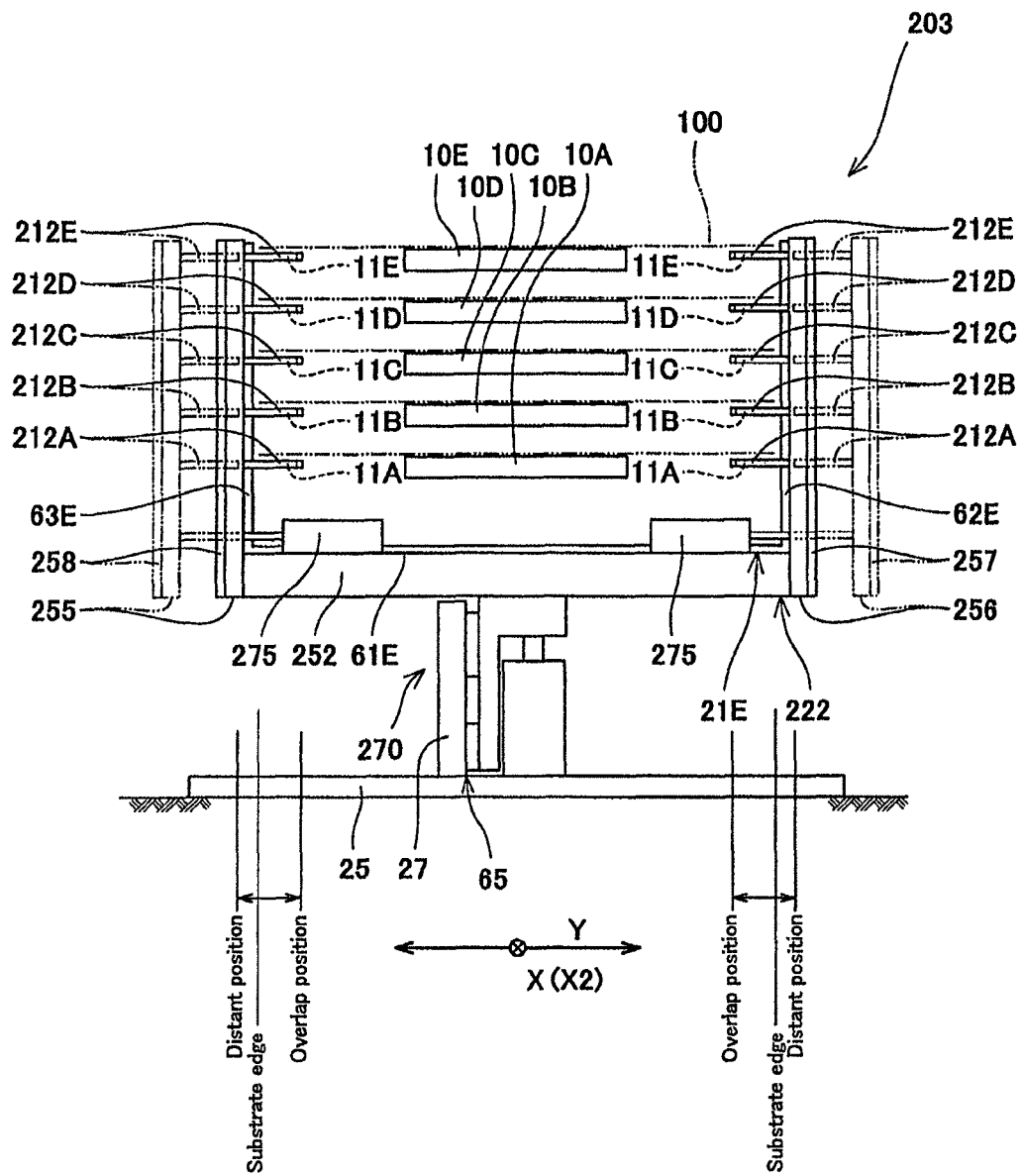
FIG. 19 is a front view of the substrate angle alignment device of FIG. 18.

FIG. 18 is a block diagram showing the configuration of an angle alignment device 203 according to Embodiment 2. FIG. 19 is a front view of the angle alignment device 203 of FIG. 18. The angle alignment device 203 according to the present embodiment is different from the angle alignment device 3 according to Embodiment 1 in that second support sections 212A to 212E are movable up and down while circumventing the substrates 100. Hereinafter, regarding the angle alignment device 203 according to Embodiment 2, this difference will be mainly described.

As shown in FIG. 18, in the angle alignment device 203, a second up-down unit 222 includes the five second support sections 212A to 212E and is movable up and down according to the operation of a single second up-down drive source 72. According to the up-down movement of the second up-down unit 222, the five second support sections 212A to 212E are moved up and down together between the second support positions and the second retracted positions. The five second support sections 212A to 212E are movable down from the second support positions to the second retracted positions while circumventing the substrates 100 held on the holding sections 10A to 10E, respectively. To this end, an up-down drive unit 270 includes circumvention drive sources 275 for moving the second support sections 212A to 212E in the radial direction of the substrates 100, in addition to the second up-down drive source 72. The circumvention drive sources 275 are able to retract the second support sections 212A to 212E to positions that are outward relative to the outer peripheries of the substrates 100 held on the holding sections 10A to 10E, respectively. A controller 280 controls the operation of the circumvention drive sources 275, as a part of the control performed for the rotation drive unit 30 and the up-down drive unit 270.

As shown in FIG. 19, for example, the second up-down unit 222 includes a base 252, and poles 255, 256 disposed to be distant from each other in the perpendicular direction Y. The five second support sections 212A to 212E are secured to the poles 255, 256 in such a manner that the second support sections 212A to 212E are arranged to be vertically spaced apart from each other. The circumvention drive sources 275 are, for example, cylinders for reciprocating in the perpendicular direction Y, the poles 255, 256 with respect to the base 252, and are fastened to the base 252. When the up-down drive source 72 (see FIG. 18) operates, the second up-down unit 222 moves vertically together with the circumvention drive sources 275, as a whole. According to the operations of the circumvention drive sources 275, the second support sections 212A to 212E are moved in the perpendicular direction Y, between overlap positions at which the second support sections 212A to 212E overlap with the substrates 100, respectively, when viewed from above, and distant positions at which the second support sections 212A to 212E do not overlap with the substrates 100 and are horizontally distant from the substrates 100, respectively, when viewed from above, irrespective of the position of the second up-down unit 222 in the vertical direction. In Embodiment 1, the circumvention drive sources are not provided. Therefore, the first support sections 11A to 11E (see FIG. 10) and the second support sections 12A to 12E (see FIG. 10) always overlap with the substrates 100, respectively, when viewed from above.

In the present embodiment, as in Embodiment 1, the five first up-down units 21A to 21E are nested into the second up-down unit 222, and the poles 255, 256 and side walls 257, 258 of the second up-down unit 222 are located outward in the perpendicular direction Y relative to the five first up-down units 21A to 21E. In this configuration, the second support sections 212A to 212E can be moved from the overlap positions to the distant positions outward in the perpendicular direction Y relative to the overlap positions, without interference of the second up-down unit 222 with the first up-down units 21A to 21E. The configuration in which the second support sections 212A to 212E are capable of circumventing the substrates 100 has an advantage because a substrate angle alignment method described below can be realized.

Figure 20:
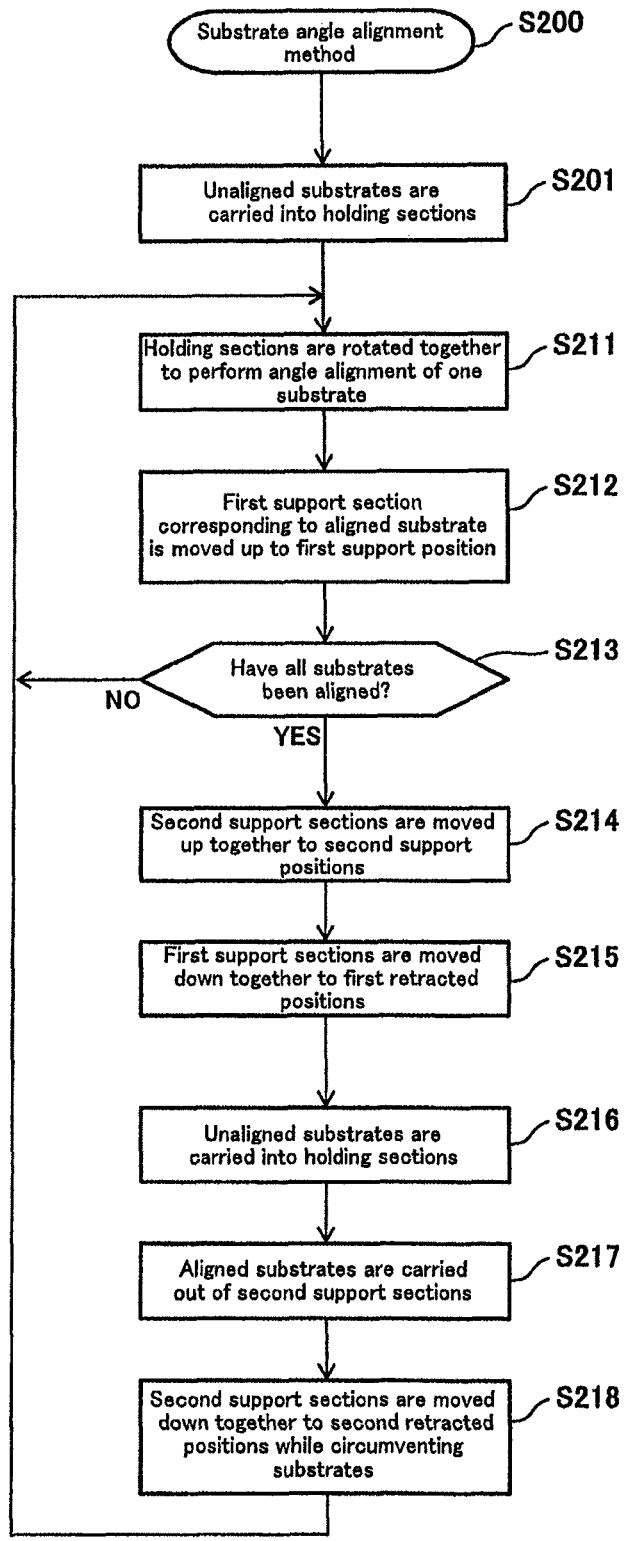
FIG. 20 is a flowchart showing the flow of the steps of a substrate angle alignment method according to Embodiment 2, which is performed in the substrate angle alignment device of FIG. 18.
Figure 21:
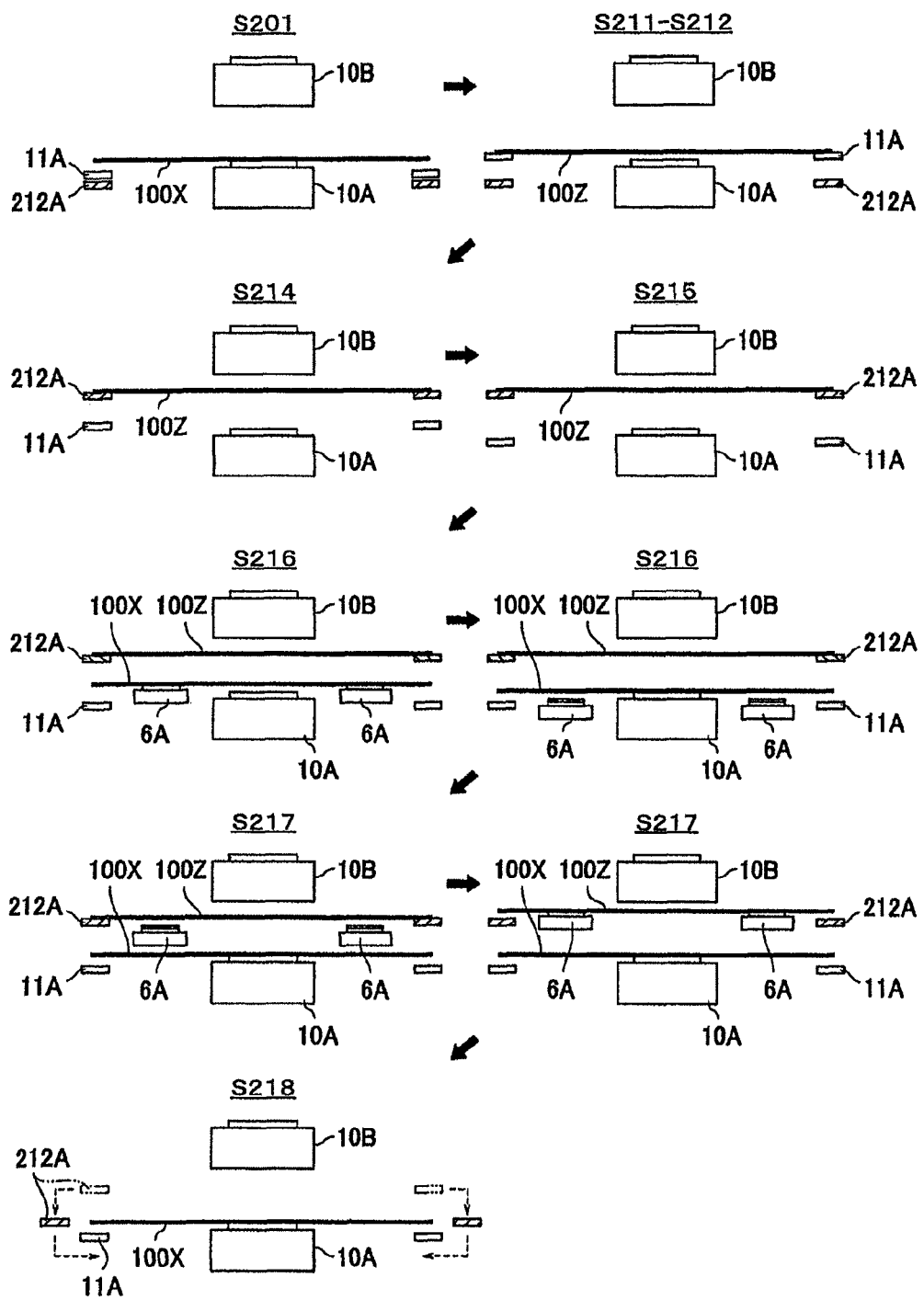
FIG. 21 is a view showing a change in the positions of the first support sections, a change in the positions of the second support sections, and a change in the states of the substrates in a case where the substrate angle alignment method of FIG. 20 is performed.

FIG. 20 is a flowchart showing the flow of the steps of a substrate angle alignment method S200 according to Embodiment 2, which is performed in the angle alignment device 203 of FIG. 18. FIG. 21 is a view showing a change in the positions of the first support sections 11A, a change in the positions of the second support sections 212A, and a change in the states of the substrates 100 in a case where the substrate angle alignment method S200 of FIG. 20 is performed.

As shown in FIGS. 20 and 21, in the substrate angle alignment method S200 according to Embodiment 2, initially, the unaligned substrates 100X are carried into the holding sections 10A to 10E, respectively (S201). Then, as in Embodiment 1, a series of angle alignment operations (S211 to S212) are performed. The series of angle alignment operations are repeated until all of the substrates 100 are lifted by the first support sections 11A to 11E, respectively (see determination step in S213). When all of the substrates 100Z are lifted by the first support sections 11A to 11E, respectively, the second support sections 212A to 212E are moved up together from the second retracted positions to the second support positions (S214). This allows the five aligned substrates 100Z to be transferred from the five first support sections 11A to 11E and loaded together to the five second support sections 212A to 212E, respectively.

This operation corresponds to the first transfer/loading operation (S114) of Embodiment 1. After this operation, the steps proceed as in the steps S115 to S117 of Embodiment 1. Specifically, before the substrates 100X are held on the holding sections 10A to 10E, respectively, the five first support sections 11A to 11E are moved down together from the first support positions to the first retracted positions (S215), the holding sections 10A to 10E receive the substrates 100X carried thereinto, respectively (S216), and the five aligned substrates are carried out of the second support sections 212A to 212E located at the second positions, respectively (S217). In this way, the angle alignment device 203 and the substrate angle alignment method S200 of the present embodiment can perform the first exchange step S1 (see FIGS. 3 and 4) of the substrate transfer method S0.

Then, the second support sections 212A to 212E are moved down from the second support positions to the second retracted positions, while circumventing the substrates 100X held on the holding sections 10A to 10E, respectively (S218). Specifically, the second support sections 212A to 212E are moved from the overlap positions to the distant positions and then moved from the second support positions to the second retracted positions. Then, the process returns to step S211, and the series of angle alignment operations are performed. In this way, in the present embodiment, the second support sections 212A to 212E are configured to be movable up and down while circumventing the substrates 100. In this configuration, even when the carry-in location of the unaligned substrates 100X is limited to the holding sections 10A to 10E, and the carry-out location of the aligned substrates 100Z is limited to the second support sections 212A to 212E located at the second support positions, the substrate angle alignment method S200 can be performed in succession without interference of the second support sections 212A to 212E with the substrates 100. In a case where the carry-in location and the carry-out location are limited in the above-described manner, the hand 6 always performs the same operations in the angle alignment device 203, and thus the operation of the hand 6 can be simplified. As a result, a teaching work of the transfer robot 5 can be simplified.

So far, the embodiments of the present invention have been described. The above-described configurations and methods are merely exemplary and can be suitably changed without departing from the scope of the invention. A system incorporating the angle alignment device 3, 203 may use a substrate transfer method different from those of the above-described embodiments.

INDUSTRIAL APPLICABILITY

The present invention can obtain remarkable advantages in that it can provide a device and a method which can improve the operation efficiency of angle alignment and the transfer efficiency of substrates when angle alignment of the substrates is performed in a state in which the substrates are placed to be oriented horizontally, and provide a method which can improve the transfer efficiency of the substrates when the substrates are transferred among a substrate storage unit, a substrate angle alignment device, and a substrate treatment device. The present invention is effectively applied to, for example, transfer or angle alignment of the substrates within a substrate treatment system which treats the substrates such as semiconductor wafers.

REFERENCE SIGNS LIST 1 substrate treatment system
2 storage unit
3, 203 angle alignment device
4 treatment device
5 transfer robot
6 (6A to 6E) hand
10A to 10E holding section
11A to 11E first support section
12A to 12E second support section
21A to 21E first up-down unit
22, 222 second up-down unit
30 rotation drive unit
31 rotation drive source
32 rotation transmission mechanism
70, 270 up-down drive unit
71A to 71E first up-down drive source
72 second up-down drive source
275 circumvention drive source
80, 280 controller
100 substrate
(100X unaligned substrates)
(100Z aligned substrates)
S0 substrate transfer method
S100, S200 substrate angle alignment method

The invention claimed is:

1. A substrate angle alignment device comprising:
a plurality of holding sections which hold a plurality of substrates, respectively in such a manner that the plurality of substrates are placed to be oriented horizontally and arranged vertically;
a rotation drive unit which rotates the plurality of holding sections together;
a first up-down unit which includes a plurality of first support sections which are equal in number to the plurality of holding sections and correspond to the plurality of holding sections, respectively, and moves the plurality of first support sections between first retracted positions that are below the substrates held on the holding sections corresponding to the first support sections, respectively, and first support positions that are above the holding sections corresponding to the first support sections, respectively;
a second up-down unit which includes a plurality of second support sections which are equal in number to the plurality of holding sections and correspond to the plurality of holding sections and the plurality of first support sections, respectively, and moves up and down the plurality of second support sections together between second retracted positions that are below the substrates held on the holding sections corresponding to the second support sections, respectively, and second support positions that are above the first support positions of the first support sections corresponding to the second support sections, respectively; and
an up-down drive unit which drives the first up-down unit and the second up-down unit.

2. The substrate angle alignment device according to claim 1,
wherein the rotation drive unit includes:
a single rotation drive source; and
a rotation transmission mechanism which transmits a driving force generated by the rotation drive source to each of the plurality of holding sections to rotate the plurality of holding sections together.

3. The substrate angle alignment device according to claim 1,
wherein the first up-down unit is one of a plurality of first up-down units,
wherein the plurality of first up-down units include the plurality of first support sections, respectively, and
wherein the up-down drive unit includes a plurality of first up-down drive sources corresponding to the plurality of first up-down units, respectively.

4. The substrate angle alignment device according to claim 1,
wherein each of the plurality of holding sections is a turn table which is rotatable around a center axis thereof,
wherein each of the plurality of first support sections constitutes a pair of first support sections which are disposed to sandwich therebetween the turn table in a direction perpendicular to a substrate carry-in direction, and
wherein each of the plurality of second support sections constitutes a pair of second support sections which are disposed to sandwich therebetween the turn table in the direction perpendicular to the substrate carry-in direction.

5. The substrate angle alignment device according to claim 4,
wherein the pair of first support sections are provided on a reference line extending through a center of the turn table and in the direction perpendicular to the substrate carry-in direction, when viewed from above, and
wherein the second support section on a first side in the direction perpendicular to the substrate carry-in direction, of the pair of second support sections, is composed of a pair of second support sections which are disposed to sandwich the first support section on the first side in the substrate carry-in direction, and the second support section on a second side in the direction perpendicular to the substrate carry-in direction, of the pair of second support sections, is composed of a pair of second support sections which are disposed to sandwich the first support section on the second side in the substrate carry-in direction.

6. The substrate angle alignment device according to claim 4,
wherein the first up-down unit includes:
a base mount disposed below the holding section at a lowermost stage and extending in the direction perpendicular to the substrate carry-in direction; and
a pair of pole members extending upward from both ends of the base mount,
wherein the pair of first support sections are provided on the pair of pole members, respectively, and
wherein the turn table is one of a plurality of turn tables which are arranged vertically in a space surrounded by the base mount and the pair of pole members.

7. The substrate angle alignment device according to claim 6,
wherein the second up-down unit includes:
a base mount disposed below the holding section at the lowermost stage and extending in the direction perpendicular to the substrate carry-in direction; and
four pole members coupled to the base mount, and
wherein the first up-down unit is accommodated in an inner region of the second up-down unit which is surrounded by the four pole members, and the second support sections are provided on the four pole members, respectively.

8. The substrate angle alignment device according to claim 7,
wherein the up-down drive unit includes a circumvention drive source which retracts the plurality of second support sections to positions that are outward relative to outer peripheral edges of the substrates held on the holding sections, corresponding to the second support sections, respectively, and
wherein the up-down drive unit is configured to move down the plurality of second support sections together from the second support positions to the second retracted positions, respectively, while circumventing the substrates held on the holding sections, respectively.

9. A substrate angle alignment method which uses a substrate angle alignment device including a plurality of holding sections, a plurality of first support sections corresponding to the plurality of holding sections, respectively, and a plurality of second support sections corresponding to the plurality of holding sections and the plurality of first support sections, respectively, the substrate angle alignment method comprising:
holding a plurality of substrates on the plurality of holding sections, respectively in such a manner that the plurality of substrates are placed to be oriented horizontally and arranged vertically;
repeating a series of angle alignment operations in which the plurality of holding sections are rotated together to perform angle alignment of one of the plurality of substrates, and the first support section corresponding to the holding section holding the substrate which has been aligned is moved up to lift up the substrate with the first support section;
performing a first transfer/loading operation in which the plurality of second support sections are moved up together to lift up the plurality of aligned substrates which are supported on the plurality of first support sections, with the plurality of second support sections, respectively;
when the first transfer/loading operation is performed, the plurality of unaligned substrates are carried into the plurality of holding sections, respectively, and the plurality of aligned substrates are carried out of the plurality of second support sections, respectively,
repeating the series of angle alignment operations; and
performing a second transfer/loading operation in which the plurality of first support sections are moved down together to transfer and load the plurality of aligned substrates which are supported on the plurality of first support sections, to the plurality of holding sections, respectively; and
when the second transfer/loading operation is performed, the plurality of unaligned substrates are carried into the plurality of second support sections, respectively, and the plurality of aligned substrates are carried out of the plurality of holding sections, respectively,
moving down the plurality of second support sections together to transfer and load the plurality of unaligned substrates which are supported on the plurality of second support sections, to the plurality of holding sections, respectively;
repeating the series of angle alignment operations; and
performing the first transfer/loading operation.

10. The substrate angle alignment method according to claim 9,
wherein after the first transfer/loading operation is performed, the plurality of first support sections are moved down to positions that are below the plurality of holding sections corresponding to the plurality of first support sections, respectively, before the plurality of substrates which are unaligned are held on the plurality of holding sections, respectively.

11. A substrate angle alignment method which uses a substrate angle alignment device including a plurality of holding sections, a plurality of first support sections corresponding to the plurality of holding sections, respectively, and a plurality of second support sections corresponding to the plurality of holding sections and the plurality of first support sections, respectively, the substrate angle alignment method comprising:
holding a plurality of substrates on the plurality of holding sections, respectively in such a manner that the plurality of substrates are placed to be oriented horizontally and arranged vertically;
repeating a series of angle alignment operations in which the plurality of holding sections are rotated together to perform angle alignment of one of the plurality of substrates, and the first support section corresponding to the holding section holding the substrate which has been aligned is moved up to lift up the substrate with the first support section;
performing a first transfer/loading operation in which the plurality of second support sections are moved up together to lift up the plurality of aligned substrates which are supported on the plurality of first support sections, with the plurality of second support sections, respectively;
when the first transfer/loading operation is performed, the plurality of unaligned substrates are carried into the plurality of holding sections, respectively, and the plurality of aligned substrates are carried out of the plurality of second support sections, respectively, moving down the plurality of second support sections together to positions that are below the holding sections corresponding to the second support sections, respectively, while circumventing the substrates held on the holding sections, respectively;
repeating the series of angle alignment operations; and
performing the first transfer/loading operation.

* * * * *